(12) United States Patent
Hori et al.

(10) Patent No.: US 12,489,031 B2
(45) Date of Patent: Dec. 2, 2025

(54) SEMICONDUCTOR DEVICE AND MANUFACTURING METHOD THEREOF

(71) Applicant: FUJI ELECTRIC CO., LTD., Kawasaki (JP)

(72) Inventors: Motohito Hori, Matsumoto (JP); Yoshinari Ikeda, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 425 days.

(21) Appl. No.: 17/973,348

(22) Filed: Oct. 25, 2022

(65) Prior Publication Data

US 2023/0187311 A1      Jun. 15, 2023

(30) Foreign Application Priority Data

Dec. 9, 2021   (JP) .................................. 2021-199976

(51) Int. Cl.
*H01L 21/00*      (2006.01)
*H01L 21/48*      (2006.01)
(Continued)

(52) U.S. Cl.
CPC ...... *H01L 23/4006* (2013.01); *H01L 21/4857* (2013.01); *H01L 21/4882* (2013.01);
(Continued)

(58) Field of Classification Search
None
See application file for complete search history.

(56) References Cited

U.S. PATENT DOCUMENTS 3,774,078 A * 11/1973 Martin ............... H05K 7/20509
                                                                174/16.3
5,793,106 A *  8/1998 Yasukawa ........... H01L 23/3121
                                                                257/713
(Continued)

FOREIGN PATENT DOCUMENTS

EP      2814055 A1      12/2014
EP      2833405 A1       2/2015
(Continued)

OTHER PUBLICATIONS

Japanese Patent Office Action issued for corresponding JP Patent Application No. 2021-199976 on Oct. 28, 2025.

*Primary Examiner* — Nicholas J Tobergte
(74) *Attorney, Agent, or Firm* — Rabin & Berdo, P.C.

(57) ABSTRACT

A semiconductor module includes a conductor layer, an insulating plate, a circuit pattern layer, and semiconductor chips disposed in this order. The conductor layer has a first through hole. The insulating plate has a second through hole having an opening size larger than the first through hole at a location facing the first through hole. The circuit pattern layer has an opening having an opening size larger than the second through hole at a location facing the second through hole. When the semiconductor module is connected to a cooling member, heat transfer medium is disposed between the conductor layer and the cooling member. A screw member is inserted into the opening and second and first through holes and screwed into a screw attachment hole. The screw member presses an area around the first through hole inside the second through hole toward the cooling member.

14 Claims, 13 Drawing Sheets

(51) Int. Cl.
    *H01L 21/56*         (2006.01)
    *H01L 23/00*         (2006.01)
    *H01L 23/40*         (2006.01)
    *H01L 23/498*       (2006.01)
    *H01L 25/065*       (2023.01)

(52) U.S. Cl.
    CPC ........ *H01L 21/56* (2013.01); *H01L 23/49822* (2013.01); *H01L 23/49844* (2013.01); *H01L 24/32* (2013.01); *H01L 24/48* (2013.01); *H01L 24/73* (2013.01); *H01L 25/0655* (2013.01); *H01L 2023/4031* (2013.01); *H01L 2023/405* (2013.01); *H01L 2023/4062* (2013.01); *H01L 2023/4068* (2013.01); *H01L 2023/4087* (2013.01); *H01L 2224/32225* (2013.01); *H01L 2224/48225* (2013.01); *H01L 2224/73265* (2013.01); *H01L 2924/1203* (2013.01); *H01L 2924/13055* (2013.01); *H01L 2924/13091* (2013.01)

(56) References Cited

U.S. PATENT DOCUMENTS

| | | | |
|---|---|---|---|
| 10,582,607 B2 * | 3/2020 | Nakamura | H05K 1/0203 |
| 11,772,829 B2 * | 10/2023 | Miyamoto | H05K 7/12 |
| | | | 361/627 |
| 2008/0079452 A1 * | 4/2008 | Park | G01R 31/2886 |
| | | | 324/754.07 |
| 2010/0091464 A1 * | 4/2010 | Ohnishi | H01L 23/645 |
| | | | 29/890.03 |
| 2011/0133320 A1 * | 6/2011 | Inokuchi | H01L 24/49 |
| | | | 438/118 |
| 2013/0112369 A1 * | 5/2013 | Matsushima | H01L 23/4006 |
| | | | 165/67 |
| 2014/0367736 A1 | 12/2014 | Iizuka et al. | |
| 2014/0374898 A1 | 12/2014 | Komatsu | |

FOREIGN PATENT DOCUMENTS

| | | |
|---|---|---|
| JP | S62-88347 A | 4/1987 |
| JP | S64-1261 A | 1/1989 |
| JP | 2004-288828 A | 10/2004 |
| JP | 2008211159 A | 9/2008 |
| JP | 2010-010568 A | 1/2010 |
| JP | 2010-034346 A | 2/2010 |
| JP | 2011-114157 A | 6/2011 |
| JP | 2012-222069 A | 11/2012 |
| WO | 2013/146212 A1 | 10/2013 |
| WO | 2014/013883 A1 | 1/2014 |

\* cited by examiner

SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2021-199976, filed on Dec. 9, 2021, the entire contents of which are incorporated herein by reference.

BACKGROUND OF THE INVENTION

1. Field of the Invention

The embodiments discussed herein relate to a semiconductor device and a semiconductor device manufacturing method.

2. Background of the Related Art

There is known a technique relating to a resin-sealing-type semiconductor device including a metal insulating plate including a metal base, an insulating layer on the metal base, and an electrically conductive pattern on the insulating layer. In this technique, an attachment hole used for attaching the semiconductor device to an external fin with a screw is formed in a part of the metal insulating plate. In addition, a semiconductor chip is mounted on the electrically conductive pattern of the metal insulating plate, and the surface on which the semiconductor chip has been mounted is sealed by resin material. A hole having a diameter larger than the attachment hole is formed in the resin material, and this hole reaches the attachment hole in the metal insulating plate (Japanese Laid-open Patent Publication No. 62-88347).

There is also known a technique relating to an electronic apparatus including a header bonded to a pellet on which a transistor circuit is formed and a resin-sealing package formed by a sealing portion on the upper surface of the header and an insulating plate portion on the lower surface of the header. In this technique, the resin-sealing package and the header each have an attachment hole that penetrates therethrough, and a self-tapping screw member is inserted into the attachment hole and screwed into a radiation plate or the like, so as to fix the electronic apparatus (Japanese Laid-open Patent Publication No. 64-1261).

There is also known a technique relating to an insulated circuit board having one surface on which a metal layer is formed and another surface on which a circuit layer bonded to semiconductor chips is formed. The one surface is warped in a concave curve and is placed to face a contact surface of a radiation member via grease. A screw is inserted into and passes through a through-hole formed in a most protruding portion of the insulated circuit board and is engaged with a female screw portion of the radiation member. In this technique, the insulated circuit board is pressed toward the contact surface of the radiation member by pressing the circuit layer at the most protruding portion (Japanese Laid-open Patent Publication No. 2004-288828).

There is also known a technique relating to a circuit apparatus including an insulating layer covering the entire upper surface of a circuit board, an electrically conductive pattern formed on a surface of the insulating layer, semiconductor elements, etc. firmly attached to predetermined portions of the electrically conductive pattern, and sealing resin that seals the semiconductor elements, etc. such that a part of the upper surface of the circuit board is exposed to the outside. In this technique, a small screw is inserted into a through-hole formed in the exposed part and is pressed, to firmly attach the circuit apparatus to a heatsink (Japanese Laid-open Patent Publication No. 2010-10568 and Japanese Laid-open Patent Publication No. 2010-34346). In this technique, when the pressing is performed, a head portion of the small screw inserted into the through-hole is brought into contact with the insulating layer remaining in the exposed area of the circuit board, the exposed area being exposed to the outside from the sealing resin. Alternatively, the head portion of the small screw is brought into contact with the insulating layer or electrically conductive pattern remaining in a circular shape surrounding the through-hole in the exposed area. Alternatively, the head portion of the small screw is brought into contact with a removed area in which the insulating layer or the electrically conductive pattern has been removed from the entire exposed area (Japanese Laid-open Patent Publication No. 2010-10568 and Japanese Laid-open Patent Publication No. 2010-34346).

There is also known a technique relating to a power semiconductor module including an insulating board having front and rear surfaces to which copper foil has been attached and semiconductor chips mounted on the insulating board. The insulating board and the semiconductor chips are molded with epoxy resin material. In this technique, a through-hole is formed in a center portion of the power semiconductor module, a bolt is inserted into the through-hole, and a radiation fin is firmly fixed to the power semiconductor module (International Publication Pamphlet No. 2013/146212).

There is also known a technique relating to a semiconductor device including an electrically-conductive-pattern-equipped insulating board, a semiconductor chip mounted thereon, a beam portion formed to face the electrically-conductive-pattern-equipped insulating board, and sealing resin having elasticity. In this technique, a through-hole is formed in a center portion of the semiconductor device. The semiconductor device is attached to a cooling member by inserting a screw into the through-hole (International Publication Pamphlet No. 2014/013883).

In addition, there is known a method for connecting a semiconductor device, which includes an insulated circuit board having a conductor layer, an insulating plate on the conductor layer, and a circuit pattern layer on the insulating plate and which includes a semiconductor chip mounted on the circuit pattern layer, to a cooling member such as a radiation base by using bonding material such as sintered material or solder. For example, sintered material such as sintered silver or sintered copper is disposed between the conductor layer of the insulated circuit board and the cooling member, and heat and pressure are applied such that the conductor layer and the cooling member are connected to each other by the sintered material. Alternatively, solder is disposed between the conductor layer of the insulated circuit board and the cooling member, and heat is applied such that the conductor layer and the cooling member are connected to each other by the solder.

However, in accordance with the above method for connecting the conductor layer of the insulated circuit board and the cooling member by using bonding material such as sintered material or solder, depending on the configuration of the semiconductor device including the insulated circuit board, the heat and pressure applied for the connection could cause, for example, remelting of the bonding material between the circuit pattern layer of the insulated circuit board and the semiconductor chip mounted thereon, could cause damage to components of the semiconductor device, or could cause separation of components of the semiconductor device. That is, the quality of the semiconductor device could deteriorate.

SUMMARY OF THE INVENTION

In one aspect of the embodiments, there is provided a semiconductor device including: a conductor layer having a first through hole; an insulating plate disposed on the conductor layer and having a second through hole having an opening size larger than an opening size of the first through hole at a position facing the first through hole; a circuit pattern layer disposed on the insulating plate and having an opening having an opening size larger than the opening size of the second through hole at a position facing the second through hole; and a semiconductor chip mounted on the circuit pattern layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

First Embodiment

Figure 1A:
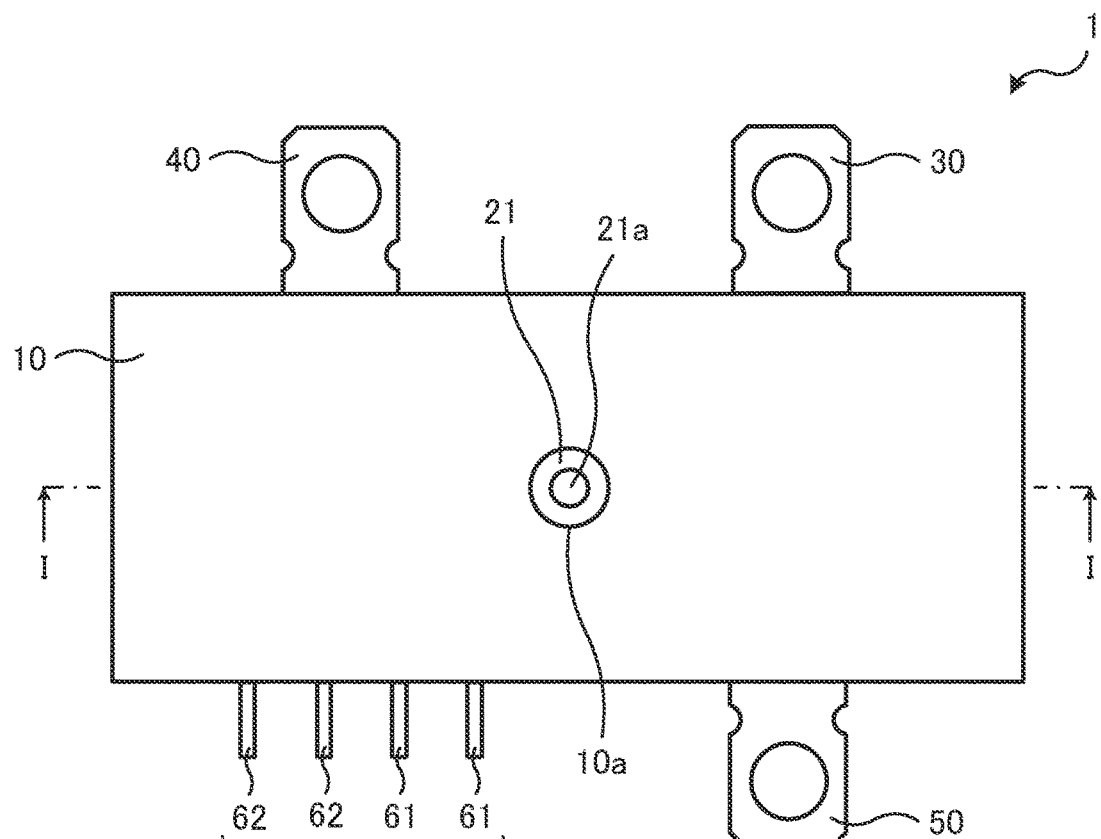
FIGS. 1A to 1C each illustrate an example of a semiconductor module according to a first embodiment.
Figure 1B:
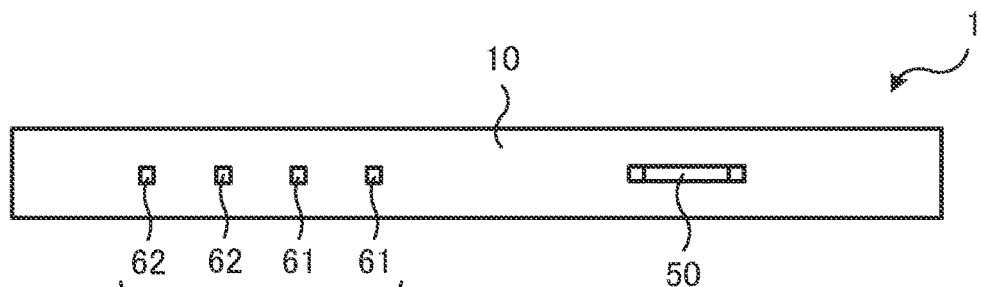
Figure 1C:
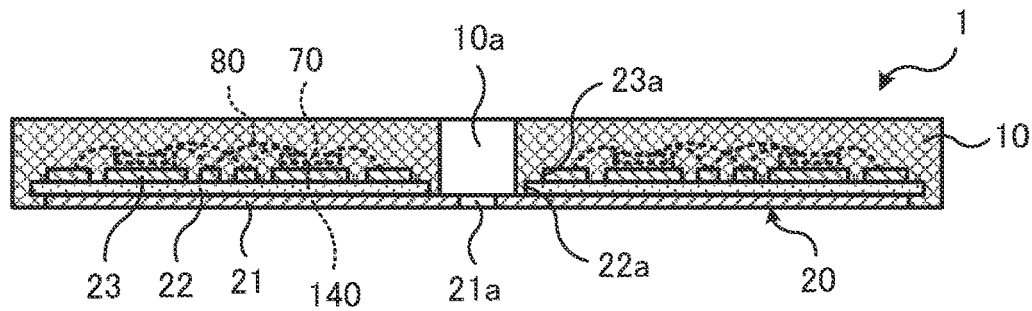

FIGS. 1A to 1C each illustrate an example of a semiconductor module according to a first embodiment. Specifically, FIG. 1A is a plan view schematically illustrating a main part of an example of a semiconductor module. FIG. 1B is a side view schematically illustrating the main part of the example of the semiconductor module. FIG. 1C is a sectional view schematically illustrating the main part of the example of the semiconductor module. FIG. 1C is a schematic sectional view taken along a line I-I in FIG. 1A.

The semiconductor module (which may be also referred to as a "semiconductor device") 1 illustrated in FIGS. 1A to 1C is an example of a 2-in-1 type semiconductor module. The semiconductor module 1 includes sealing resin 10 and an insulated circuit board 20 formed inside the sealing resin 10. Resin material such as epoxy resin is used as the sealing resin 10. The sealing resin 10 may contain insulating filler such as silica. Semiconductor chips 70 are mounted on the insulated circuit board 20 via bonding material 140 such as sintered material or solder, and the semiconductor chips 70 are connected to the insulated circuit board 20 by using electrically conductive members 80 such as wires. In addition, a positive (P) terminal 30, a negative (N) terminal 40, an output terminal 50, and control terminals 60 are connected to the insulated circuit board 20. The P terminal 30, the N terminal 40, the output terminal 50, and the individual control terminals 60 each have one end that is formed inside the sealing resin 10 and that is connected to a predetermined portion of the insulated circuit board 20. The other end of each of the above terminals extends to the outside of the sealing resin 10 and is used for external connection of the semiconductor module 1.

As illustrated in FIG. 1C, the insulated circuit board 20 includes a conductor layer 21, an insulating plate 22 disposed on the conductor layer 21, and a circuit pattern layer 23 disposed on the insulating plate 22. Material having a good thermal conductivity, e.g., metal material such as copper, is used for the conductor layer 21. Material having a good thermal conductivity and insulating property, e.g., ceramic material such as alumina, complex ceramic material containing alumina as its main component, aluminum nitride, or silicon nitride, is used for the insulating plate 22. Other than the above examples, resin material may be used for the insulating plate 22. Material having a good electrical conductivity, e.g., metal material such as copper, is used for the circuit pattern layer 23. The circuit pattern layer 23 is divided into predetermined patterns such that predetermined circuits of the semiconductor module 1 are formed with the semiconductor chips 70, etc. mounted on the insulated circuit board 20 and the P terminal 30, the N terminal 40, the output terminal 50, and the control terminal 60 connected to the circuit pattern layer 23. For example, a direct copper bonding (DCB) substrate, an active metal brazed (AMB) substrate, or the like is used as the insulated circuit board 20 including the conductor layer 21, the insulating plate 22, and the circuit pattern layer 23 as described above.

The conductor layer 21 of the insulated circuit board 20 has a first through hole 21a. The insulating plate 22 disposed on the conductor layer 21 has a second through hole 22a having an opening size larger than the first through hole 21a at a location facing the first through hole 21a in the conductor layer 21. The circuit pattern layer 23 disposed on the insulating plate 22 has an opening portion (opening) 23a having an opening size larger than the second through hole 22a at a location facing the second through hole 22a in the insulating plate 22.

The sealing resin 10 is formed to seal the circuit pattern layer 23 (and the semiconductor chips 70, etc. formed on the circuit pattern layer 23) of the insulated circuit board 20. The sealing resin 10 is formed such that a main surface of the conductor layer 21 of the insulated circuit board 20 (the main surface being located in a direction opposite to the insulating plate 22) is exposed to the outside. The sealing resin 10 has a third through hole 10a having an opening size larger than the first through hole 21a at a location facing the first through hole 21a in the conductor layer 21 (and the second through hole 22a in the insulating plate 22 and the opening portion 23a in the circuit pattern layer 23). The third through hole 10a in the sealing resin 10 is formed to have an opening size smaller than the opening portion 23a in the circuit pattern layer 23 or the second through hole 22a in the insulating plate 22. FIGS. 1A and 1C illustrate, as an example, the third through hole 10a having an opening size smaller than the second through hole 22a.

For example, the first through hole 21a, the second through hole 22a, and the opening portion 23a in the insulated circuit board 20 and the third through hole 10a in the sealing resin 10 are formed in a center portion of the semiconductor module 1.

The above insulated circuit board 20 used in the semiconductor module 1 will be described in more detail with reference to FIGS. 2A to 2C and FIGS. 3A to 3C.

Figure 2A:
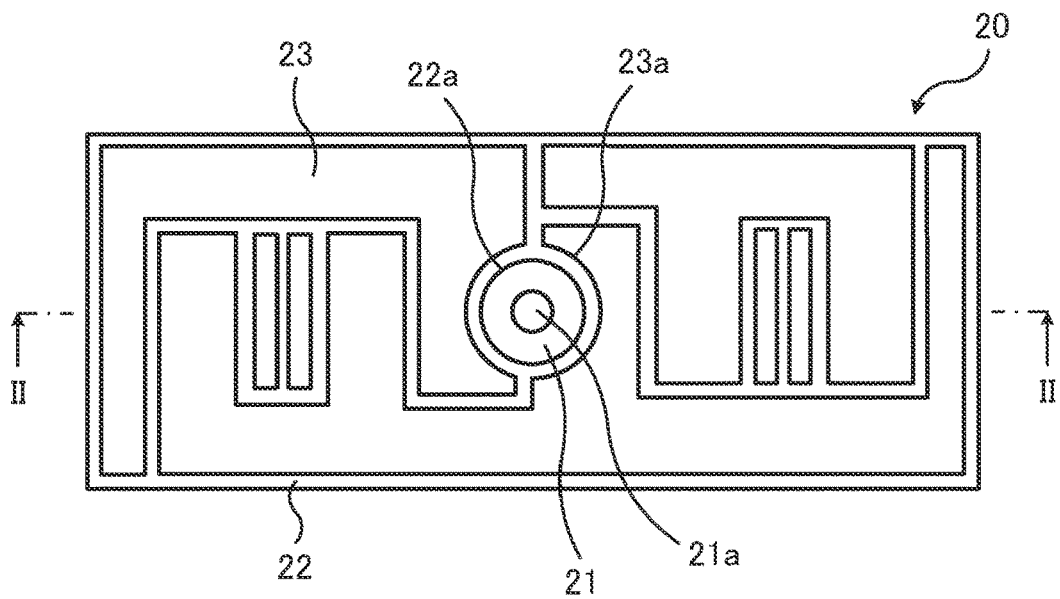
FIGS. 2A to 2C each illustrate an example of an insulated circuit board according to the first embodiment.
Figure 2B:
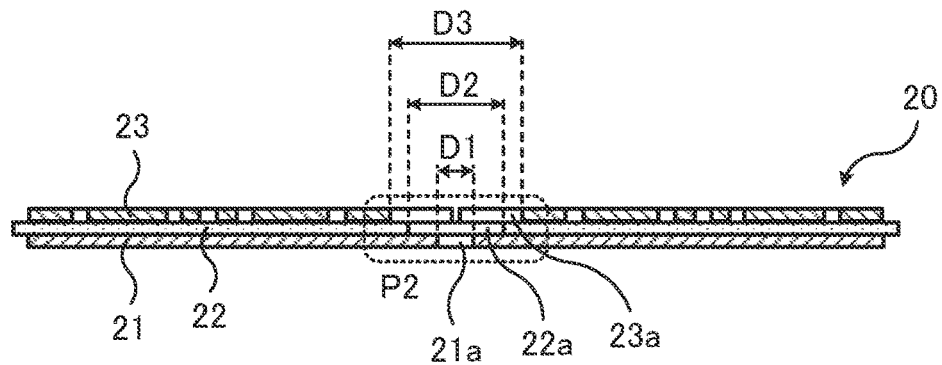
Figure 2C:
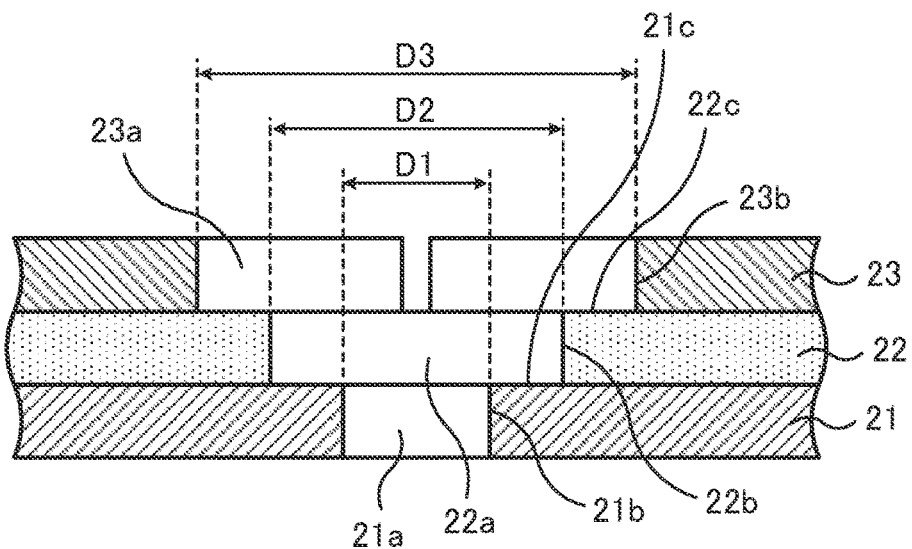

FIGS. 2A to 2C each illustrate an example of the insulated circuit board according to the first embodiment. Specifically, FIG. 2A is a plan view schematically illustrating a main part of an example of the insulated circuit board. FIGS. 2B and 2C are each a sectional view schematically illustrating the main part of the example of the insulated circuit board. FIG. 2B is a schematic sectional view taken along a line II-II in FIG. 2A. FIG. 2C is an expanded sectional view of a portion P2 in FIG. 2B.

Figure 3A:
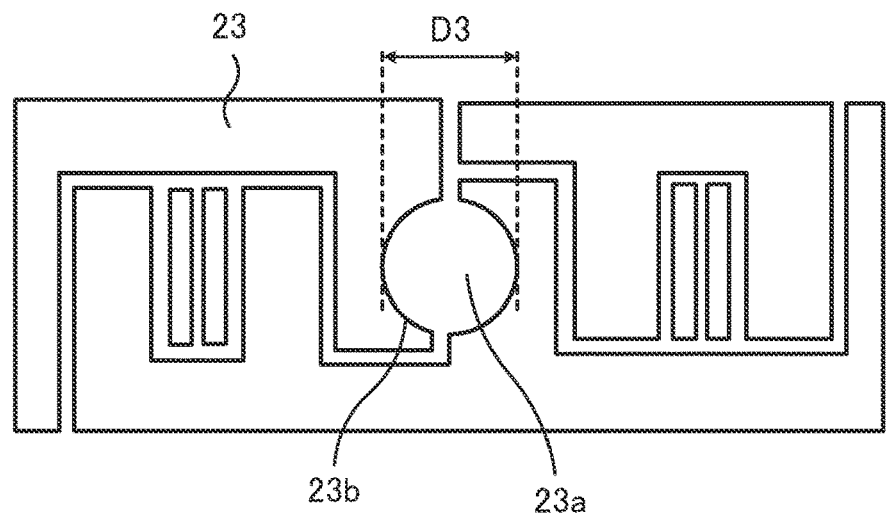
FIGS. 3A to 3C are each an exploded view of an individual layer of the example of the insulated circuit board according to the first embodiment.
Figure 3B:
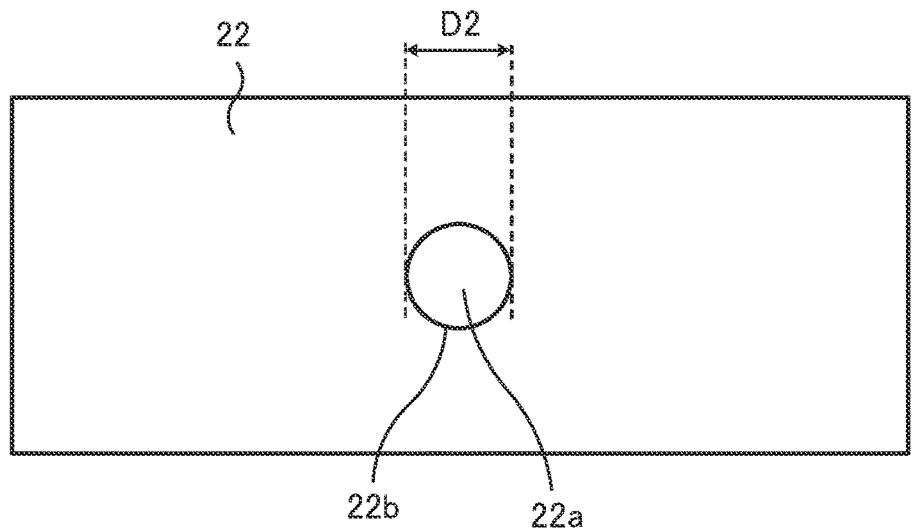
Figure 3C:
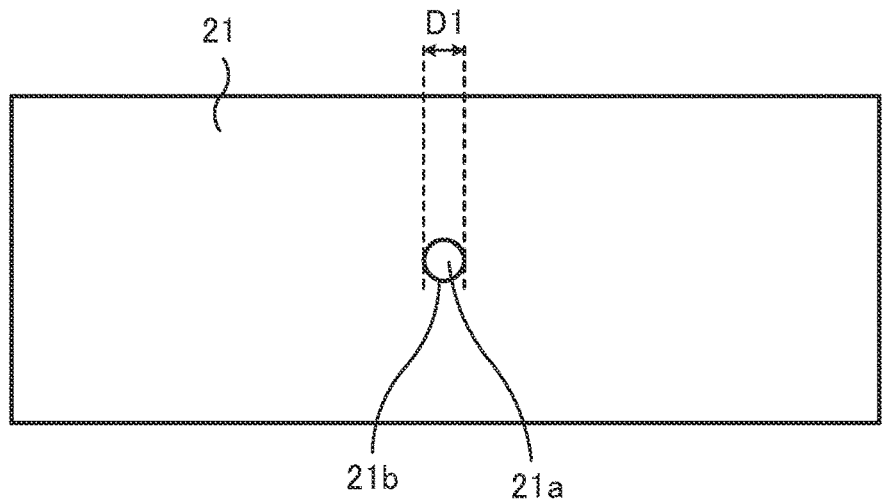

In addition, FIGS. 3A to 3C are each an exploded view of an individual layer of the example of the insulated circuit board according to the first embodiment. Specifically, FIG. 3A is an exploded plan view schematically illustrating a main part of the circuit pattern layer. FIG. 3B is an exploded plan view schematically illustrating a main part of the insulating plate. FIG. 3C is an exploded plan view schematically illustrating a main part of the conductor layer.

As illustrated in FIGS. 2A to 2C, the insulated circuit board 20 includes the conductor layer 21, the insulating plate 22 on the conductor layer 21, and the circuit pattern layer 23 on the insulating plate 22. As illustrated in FIGS. 2A to 2C and FIG. 3C, the first through hole 21a having an opening size having a diameter D1 is formed in the conductor layer 21. In addition, as illustrated in FIGS. 2A to 2C and FIG. 3B, the second through hole 22a having an opening size having a diameter D2 larger than the first through hole 21a in the conductor layer 21 is formed in the insulating plate 22. In addition, as illustrated in FIGS. 2A to 2C and FIG. 3A, the opening portion 23a having an opening size having a diameter D3 larger than the second through hole 22a in the insulating plate 22 is formed in the circuit pattern layer 23.

The first through hole 21a in the conductor layer 21 is formed inside the second through hole 22a in the insulating plate 22 in plan view and in sectional view, as illustrated in FIGS. 2A to 2C, and a terrace area 21c of the conductor layer 21 is located between an inner edge 21b of the first through hole 21a and an inner edge 22b of the second through hole 22a. As illustrated in FIGS. 2A to 2C, the second through hole 22a in the insulating plate 22 (and the first through hole 21a in the conductor layer 21) is formed inside the opening portion 23a in the circuit pattern layer 23 in plan view and in sectional view, and a terrace area 22c of the insulating plate 22 is located between the inner edge 22b of the second through hole 22a and an inner edge 23b of the opening portion 23a.

The diameter D1 of the first through hole 21a formed in the conductor layer 21 of the insulated circuit board 20 is set such that a screw portion at a tip portion of a screw member used for connecting the insulated circuit board 20 to a cooling member as will be described below is inserted into the first through hole 21a and such that a head portion being located in a direction opposite to the screw portion is not inserted into the first through hole 21a, for example.

Components such as the above semiconductor chips 70 are mounted on predetermined portions of the circuit pattern layer 23 of the above insulated circuit board 20.

Figure 4:
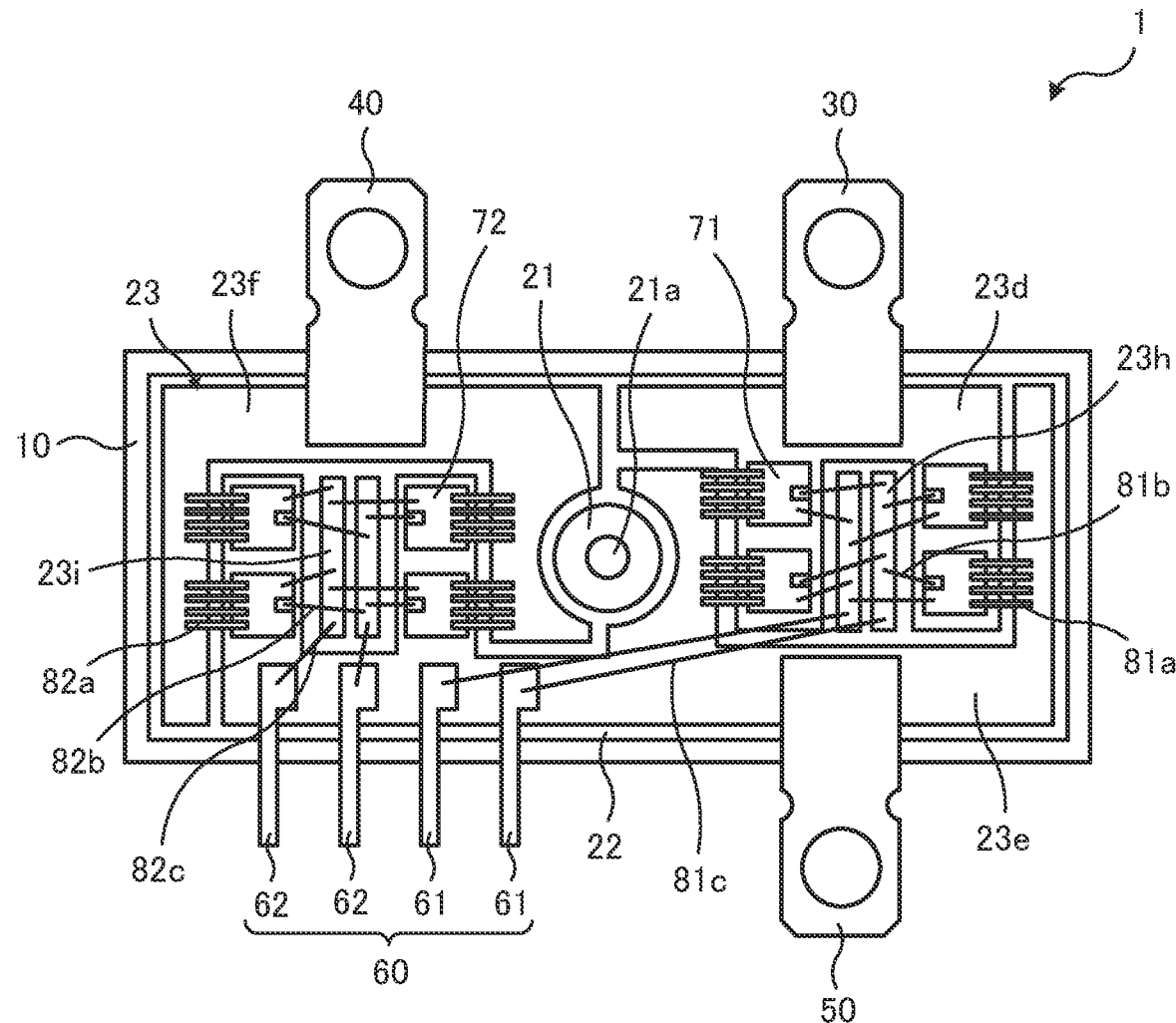
FIG. 4 illustrates a configuration example of the semiconductor module according to the first embodiment.

FIG. 4 illustrates a configuration example of the semiconductor module according to the first embodiment. Specifically, FIG. 4 is a plan view schematically illustrating a main part of an example of an internal configuration of the semiconductor module.

FIG. 4 schematically illustrates an example of a configuration inside the sealing resin 10 of the semiconductor module 1 by omitting illustration of part of the sealing resin 10. The semiconductor module 1 illustrated in FIG. 4 is an example of a semiconductor module having a 2-in-1 type configuration.

The circuit pattern layer 23 of the insulated circuit board 20 includes a first pattern portion 23d, a second pattern portion 23e, a third pattern portion 23f, fourth pattern portions 23h, and fifth pattern portions 23i.

Semiconductor chips 70, e.g., four semiconductor chips 71 in FIG. 4, which constitute an upper arm are mounted on the first pattern portion 23d of the circuit pattern layer 23 via bonding material such as sintered material or solder (not illustrated). Semiconductor chips 70, e.g., four semiconductor chips 72 in FIG. 4, which constitute a lower arm are mounted on the second pattern portion 23e of the circuit pattern layer 23 via bonding material such as sintered material or solder (not illustrated). A semiconductor element, such as a reverse conducting-insulated gate bipolar transistor (RC-IGBT) or a metal-oxide-semiconductor field-effect transistor (MOSFET), is used for the individual semiconductor chip 71 or semiconductor chip 72, for example. A MOSFET includes a body diode connected to its switching region in inverse parallel. If an RC-IGBT is used for a semiconductor chip 71 or 72, a diode connected in inverse parallel is included in the semiconductor chip 71 or 72.

Each of the semiconductor chips 71 and the semiconductor chips 72 includes one main surface (a lower surface in this example) on which a first load electrode (for example, a positive electrode) is formed and the other main surface (an upper surface in this example) on which a second load electrode (for example, a negative electrode) and a control electrode (including a sense electrode at the same potential as a second load electrode) are formed. For example, the first load electrode on the lower surface functions as a collector electrode or a drain electrode. The second load electrode on the upper surface functions as an emitter electrode or a source electrode. The control electrode on the upper surface functions as a gate electrode. The second load electrode is connected to an auxiliary source wire (in the case of a MOSFET) or an auxiliary emitter wire (in the case of an RC-IGBT) for measuring a reference potential with respect to the gate.

Regarding the individual semiconductor chip 71 of the upper arm, the first load electrode on the lower surface is connected to the first pattern portion 23d, to which the P terminal 30 is connected, via bonding material, and the second load electrode on the upper surface is connected to the second pattern portion 23e, to which the output terminal 50 is connected, via conductive members 81a such as wires. Regarding the individual semiconductor chip 72 of the lower arm, the first load electrode on the lower surface is connected to the second pattern portion 23e, to which the output terminal 50 is connected, via bonding material, and the second load electrode on the upper surface is connected to the third pattern portion 23f, to which the N terminal 40 is connected, via conductive members 82a such as wires. Regarding the individual semiconductor chip 71 of the upper arm, the control electrode (including the sense electrode) on the upper surface is connected to a corresponding fourth pattern portion 23h of the circuit pattern layer 23 via a corresponding conductive member 81b such as a wire, and the individual fourth pattern portion 23h is connected to a corresponding control terminal 60 (a control terminal 61) via a corresponding conductive member 81c such as a wire. Regarding the individual semiconductor chip 72 of the lower arm, the control electrode (including the sense electrode) on the upper arm is connected to a corresponding fifth pattern portion 23i of the circuit pattern layer 23 via a corresponding conductive member 82b such as a wire, and the individual fifth pattern portion 23i is connected to a corresponding control terminal 60 (a control terminal 62) via a corresponding conductive member 82c such as a wire.

In the semiconductor module 1, the semiconductor chips 71 connected to the P terminal 30 and the control terminals 61 and the semiconductor chips 72 connected to the N terminal 40 and the control terminals 62 are connected in series, and the output terminal 50 is connected to a node connecting the semiconductor chips 71 and the semiconductor chips 72. In the semiconductor module 1, a current that flows from the P terminal 30 first flows through the first pattern portion 23d, next flows through the second pattern portion 23e via the semiconductor chips 71 of the upper arm controlled by the control terminals 61 and via the conductive members 81a, and finally flows to the output terminal 50. A current that flows from the output terminal 50 first flows through the second pattern portion 23e, next flows through the third pattern portion 23f via the semiconductor chips 72 of the lower arm controlled by the control terminals 62 and via the conductive members 82a, and finally flows to the N terminal 40.

For example, three semiconductor modules, each of which corresponds to the semiconductor module 1 as described above, are connected in parallel with each other. In each of these parallel-connected semiconductor modules 1, a node connecting the series-connected semiconductor chips 71 and 72 connected to the corresponding output terminal 50 functions as a U-phase, V-phase, or W-phase output node and is connected to a load such as a motor.

FIG. 4 illustrates, as an example, the semiconductor module 1 including the four semiconductor chips 71 constituting the upper arm and the four semiconductor chips 72 constituting the lower arm. However, the number of semiconductor chips 71 or 72 of the semiconductor module 1 is not limited to the above example. The circuit pattern layer 23 of the insulated circuit board 20 may have any patterns, depending on the number or layout of the semiconductor chips 71 and 72 mounted thereon.

In the case of the insulated circuit board 20 of the semiconductor module 1 illustrated in FIG. 1A to FIG. 4, as described above, the first through hole 21a having the diameter D1 is formed in the conductor layer 21. In addition, the second through hole 22a having the diameter D2 larger than the diameter D1 is formed in the insulating plate 22, and the opening portion 23a having the diameter D3 larger than the diameter D2 is formed in the circuit pattern layer 23. In addition, the third through hole 10a having a diameter larger than the diameter D1 of the first through hole 21a, for example, a diameter larger than the diameter D1 and smaller than the diameter D2, is formed in the sealing resin 10. The first through hole 21a, the second through hole 22a, the opening portion 23a, and the third through hole 10a are located to face each other.

When the insulated circuit board 20 of the semiconductor module 1 is connected to a cooling member such as a radiation base, heat transfer medium such as compound or a heat conduction sheet is inserted between the conductor layer 21 of the insulated circuit board 20 and the cooling member. Next, a screw member is inserted into the third through hole 10a in the sealing resin 10 and the opening portion 23a, the second through hole 22a, and the first through hole 21a in the insulated circuit board 20, and a tip portion of the screw member is screwed into the cooling member. The insulated circuit board 20 is formed such that, when the screw member is screwed into the cooling member, a head portion of the screw member screwed, the head portion being located in a direction opposite to the tip portion, presses an area (the terrace area 21c) around the first through hole 21a in the conductor layer 21 inside the second through hole 22a in the insulating plate 22 toward the cooling member.

In the case of the semiconductor module 1, bonding material such as sintered material or solder is not used to connect the insulated circuit board 20 and the cooling member to each other. Instead, for example, heat transfer medium such as compound or a heat conduction sheet and a screw member are used for the connection. Thus, no application of heat or pressure is needed for the connection. As a result, the bonding material 140 such as sintered material or solder connecting the semiconductor chips 70 (the semiconductor chips 71 and the semiconductor chips 72) to the circuit pattern layer 23 (the first pattern portion 23d and the second pattern portion 23e) of the insulated circuit board 20 is prevented from being melted again by heat. In addition, the semiconductor chips 70 and components connected thereto are prevented from being damaged by pressure. In addition, the sealing resin 10 is prevented from being peeled (separated) by the heat or pressure from the insulated circuit board 20 on which the semiconductor chips 70, etc. are mounted. In addition, in the present embodiment, when the insulated circuit board 20 is connected to the cooling member by using the screw member, the screw member presses the conductor layer 21 of the insulated circuit board 20. If the circuit pattern layer 23 is pressed, the circuit pattern layer 23 could be damaged or a defect relating to the electrical connection between the circuit pattern layer 23 and the screw member could occur. However, according to the present embodiment, such occurrence of damage or a defect is prevented. In addition, if the insulating plate 22 is pressed, the insulating plate 22 could be damaged. However, according to the present embodiment, such occurrence of damage is prevented.

By using the insulated circuit board 20, the semiconductor module 1 effectively prevents quality deterioration that could occur when the semiconductor module 1 is connected to the cooling member via the conductor layer 21.

Hereinafter, examples of the connection between the semiconductor module 1 having the above configuration and a cooling member will be described as second to fourth embodiments.

Second Embodiment

Figure 5:
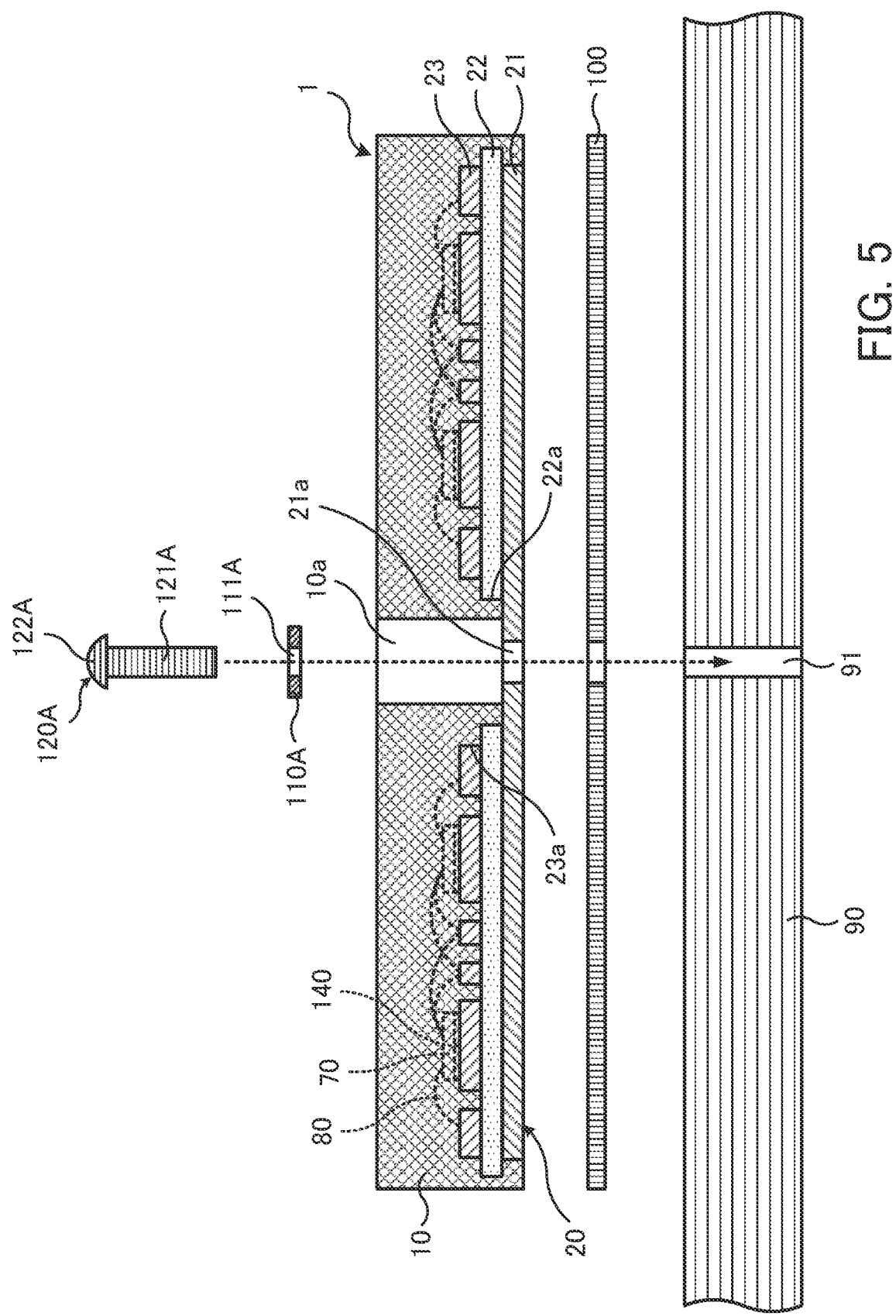
FIG. 5 illustrates an example of a semiconductor device according to a second embodiment (part 1)
Figure 6:
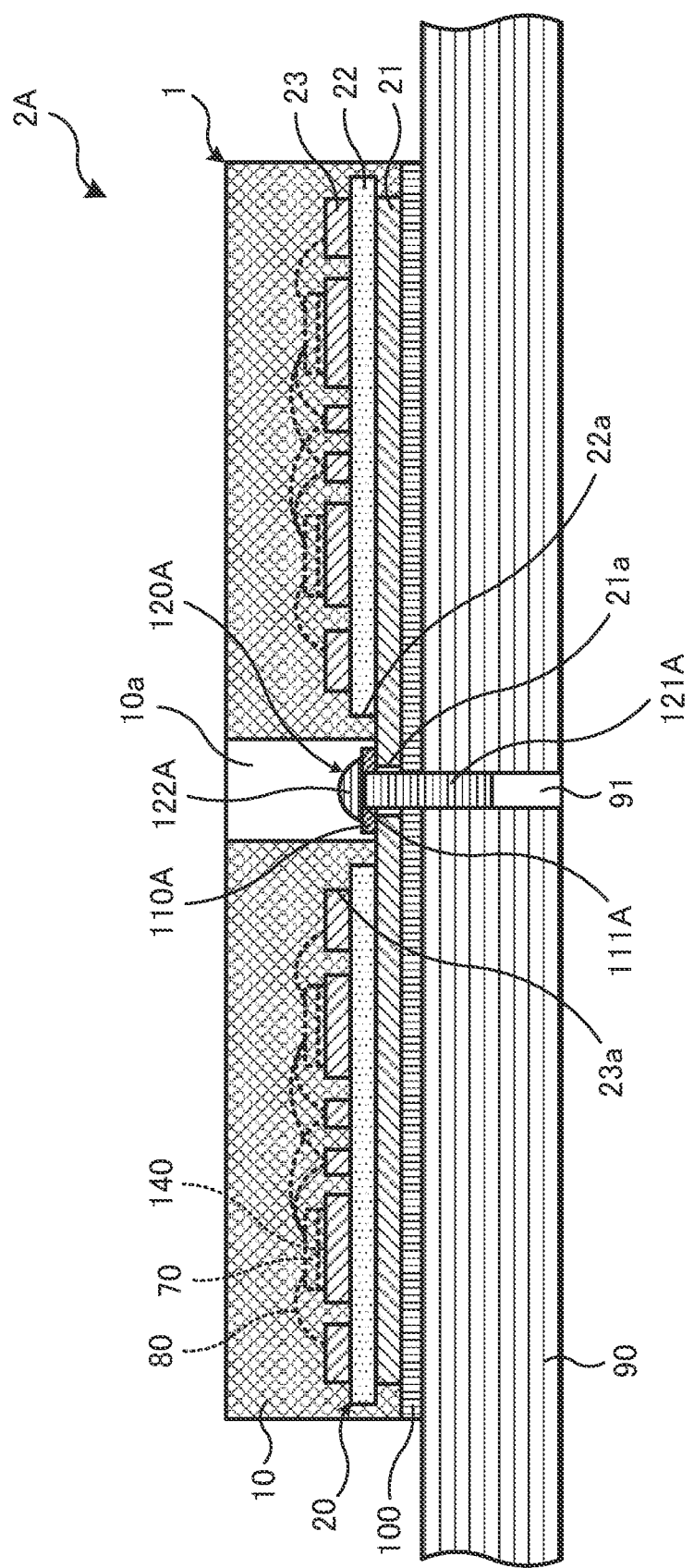
FIG. 6 illustrates the example of the semiconductor device according to the second embodiment (part 2)

FIGS. 5 and 6 each illustrate an example of a semiconductor device according to a second embodiment. Specifically, FIG. 5 is an exploded sectional view schematically illustrating a main part of an example of the semiconductor device. FIG. 6 is a sectional view schematically illustrating the main part of the example of the semiconductor device.

To assemble (manufacture) the semiconductor device including the semiconductor module 1 as described in the above first embodiment, the semiconductor module 1, a cooling member 90, a heat transfer medium 100, a washer 110A, and a screw member 120A as illustrated in FIG. 5 are prepared.

For example, a metal plate that functions as a radiation base, a heatsink, or the like is used as the cooling member 90. Metal material having a good thermal conductivity, e.g., a metal plate such as copper or aluminum, is used for the metal plate used as the cooling member 90. The metal plate used as the cooling member 90 may include plate-like or needle-like fins. The metal plate may include a flow channel through which liquid or gaseous refrigerant flows. The cooling member 90 is disposed near a surface of the conductor layer 21 of the semiconductor module 1, the surface being exposed from the sealing resin 10. That is, the cooling member 90 is disposed near a surface of the conductor layer 21, the surface being located in a direction opposite to the insulating plate 22. The cooling member 90 has a screw attachment hole 91 in a location facing the first through hole 21a in the conductor layer 21, and the screw member 120A inserted into the first through hole 21a is screwed into the screw attachment hole 91.

The heat transfer medium 100 is disposed between the semiconductor module 1 and the cooling member 90. For example, thermal interface material (TIM) such as compound or a heat conduction sheet is used as the heat transfer medium 100. The heat transfer medium 100 may be applied or attached in advance to the conductor layer 21 exposed from the sealing resin 10 of the semiconductor module 1. Alternatively, the heat transfer medium 100 may be applied or attached in advance to a surface of the cooling member 90, the surface facing the conductor layer 21 of the semiconductor module 1. When disposed between the semiconductor module 1 and the cooling member 90, the heat transfer medium 100 is disposed around the first through hole 21a in the conductor layer 21 of the semiconductor module 1 and the screw attachment hole 91 in the cooling member 90.

For example, the washer 110A and the screw member 120A are each made of metal material. For example, if the washer 110A and the screw member 120A each have a sufficient mechanical strength and if a sufficient connection strength is ensured when the semiconductor module 1 and the cooling member 90 are connected to each other by using the washer 110A and the screw member 120A, the washer 110A and the screw member 120A may be made of resin material.

A flat washer storable in the third through hole 10a in the sealing resin 10 and having an outer diameter contactable with the area (the terrace area 21c) around the first through hole 21a in the conductor layer 21 is used as the washer 110A. The washer 110A has a hole 111A having an opening size into which a screw portion 121A of the screw member 120A inserted into the first through hole 21a in the conductor layer 21 is insertable.

A screw, a bolt, or a small screw is used as the screw member 120A. The screw member 120A includes the screw portion 121A and a head portion 122A. The screw portion 121A has a diameter that is insertable into the hole 111A in the washer 110A and the first through hole 21a in the conductor layer 21 and has a tip portion that is screwed into the screw attachment hole 91 in the cooling member 90. The head portion 122A is located in a direction opposite to the tip portion of the screw portion 121A. The head portion 122A has a diameter larger than the hole 111A in the washer 110A and smaller than the third through hole 10a in the sealing resin 10. That is, the screw member 120A has the head portion 122A having a size storable in the third through hole 10a in the sealing resin 10 along with the washer 110A.

If the third through hole 10a in the sealing resin 10 is formed to have an opening size larger than the second through hole 22a in the insulating plate 22, the washer 110A is formed to have an outer diameter smaller than the second through hole 22a in the insulating plate 22, and the screw member 120A is formed to have the head portion 122A having a diameter smaller than the second through hole 22a.

The washer 110A is formed such that the outer diameter thereof comes into contact with the area (the terrace area 21c) around the first through hole 21a in the conductor layer 21, the area being inside the second through hole 22a in the insulating plate 22 inside the third through hole 10a in the sealing resin 10. The screw member 120A is formed such that the head portion 122A presses the washer 110A toward the cooling member 90.

To assemble the semiconductor device 2A, for example, the semiconductor module 1, the cooling member 90, the heat transfer medium 100, the washer 110A, and the screw member 120A as illustrated in FIG. 5 are prepared. The semiconductor module 1 and the cooling member 90 are disposed such that the first through hole 21a and the screw attachment hole 91 face each other, and the heat transfer medium 100 is disposed between the semiconductor module 1 and the cooling member 90. Next, the screw member 120A is inserted into the hole 111A in the washer 110A, and the screw portion 121A is inserted into the third through hole 10a in the sealing resin 10, the opening portion 23a in the circuit pattern layer 23, the second through hole 22a in the insulating plate 22, and the first through hole 21a in the conductor layer 21. The tip portion of the inserted screw portion 121A is screwed into the screw attachment hole 91 in the cooling member 90. As a result, the semiconductor device 2A as illustrated in FIG. 6, that is, the semiconductor device 2A in which the semiconductor module 1 and the cooling member 90 are connected to each other via the heat transfer medium 100 by using the screw member 120A and the washer 110A, is obtained.

In the case of the semiconductor device 2A illustrated in FIG. 6, the tip portion of the screw portion 121A of the screw member 120A inserted into the third through hole 10a in the sealing resin 10, the opening portion 23a in the circuit pattern layer 23, the second through hole 22a in the insulating plate 22, and the first through hole 21a in the conductor layer 21 is screwed into the screw attachment hole 91 in the cooling member 90. In the case of the semiconductor module 1, the conductor layer 21 is pressed toward the cooling member 90 by the head portion 122A of the screw member 120A via the washer 110A and is connected to the cooling member 90 via the heat transfer medium 100.

At this point, the washer 110A comes into contact with the area (terrace area 21c) around the first through hole 21a in the conductor layer 21, the area being inside the second through hole 22a in the insulating plate 22 inside the third through hole 10a in the sealing resin 10. The washer 110A that comes into contact with the area around the first through hole 21a in the conductor layer 21 is pressed toward the cooling member 90 by the head portion 122A of the screw member 120A screwed into the screw attachment hole 91 in the cooling member 90. Thus, in the case of the semiconductor module 1, the conductor layer 21 is pressed toward the cooling member 90 by the screw member 120A and the washer 110A and is connected to the cooling member 90 via the heat transfer medium 100. If the conductor layer 21, which is pressed toward the cooling member 90 by the screw member 120A and the washer 110A, is formed to be relatively thick, because the rigidity of the conductor layer 21 is improved, the connection strength between the semiconductor module 1 and the cooling member 90 via the conductor layer 21 is improved.

In the case of the semiconductor device 2A, bonding material such as sintered material or solder is not used to connect the semiconductor module 1 and the cooling member 90 to each other. Instead, the heat transfer medium 100 such as TIM, the screw member 120A, and the washer 110A are used for the connection. Thus, no application of heat or pressure is needed for the connection. As a result, the bonding material 140 such as sintered material or solder connecting the semiconductor chips 70 to the circuit pattern layer 23 is prevented from being melted again by heat. In addition, the semiconductor chips 70 and components connected thereto are prevented from being damaged by pressure. In addition, the sealing resin 10 is prevented from being peeled by the heat or pressure from the insulated circuit board 20 on which the semiconductor chips 70, etc. are mounted.

In addition, in the case of the semiconductor device 2A, the area around the first through hole 21a in the conductor layer 21 is pressed toward the cooling member 90 by the head portion 122A of the screw member 120A via the washer 110A. If the circuit pattern layer 23 is pressed, the circuit pattern layer 23 could be damaged or a defect relating to the electrical connection between the circuit pattern layer 23 and the metal screw member 120A and washer 110A could occur. However, according to the present embodiment, such occurrence of damage or a defect is prevented. In addition, if the insulating plate 22 is pressed, the insulating plate 22 could be damaged. However, according to the present embodiment, such occurrence of damage is prevented.

Thus, the semiconductor device 2A effectively prevents quality deterioration that could occur when the semiconductor module 1 is connected to the cooling member 90 via the conductor layer 21.

In addition, in the case of the semiconductor device 2A, if the screw member 120A and washer 110A are made of metal material, the conductor layer 21 and the cooling member 90 are thermally connected to each other via the washer 110A and the screw member 120A. The heat generated by the semiconductor module 1 is transferred to the cooling member 90 via not only the heat transfer medium 100 but also the washer 110A and the screw member 120A. As a result, the heat dissipation from the semiconductor module 1 is improved, and damage to and performance deterioration of the semiconductor module 1 by overheating are prevented.

In the case of the semiconductor device 2A, if the screw member 120A and the washer 110A are made of metal material, the conductor layer 21 and the cooling member 90 are electrically connected to each other via the washer 110A and the screw member 120A. In addition, the head portion 122A of the screw member 120A of the semiconductor device 2A is stored inside the third through hole 10a in the sealing resin 10 along with the washer 110A. Thus, a sufficient creepage distance (insulation distance) is ensured between these screw member 120A and washer 110A and the above-described P terminal 30, N terminal 40, output terminal 50, and control terminals 60 extending from the sealing resin 10 to the outside. Thus, by using these metal screw member 120A and washer 110A, electrical defects of the semiconductor module 1 such as noise and performance deterioration of the semiconductor module 1 are prevented.

If the screw member 120A and the washer 110A each have a sufficient mechanical strength, if a sufficient connection strength between the semiconductor module 1 and the cooling member 90 is ensured, and if the above thermal and electrical connection of the screw member 120A and the washer 110A to the cooling member 90 is not needed, the screw member 120A and the washer 110A may be made of resin material.

In the case of the semiconductor device 2A, the semiconductor module 1 and the cooling member 90 are connected to each other by screwing of the screw member 120A via the heat transfer medium 100 such as TIM. While use of bonding material such as sintered material or solder needs particular equipment, no such particular equipment is needed in the present embodiment. That is, the semiconductor module 1 is connectable to a cooling member 90 of any kind or size.

Third Embodiment

Figure 7:
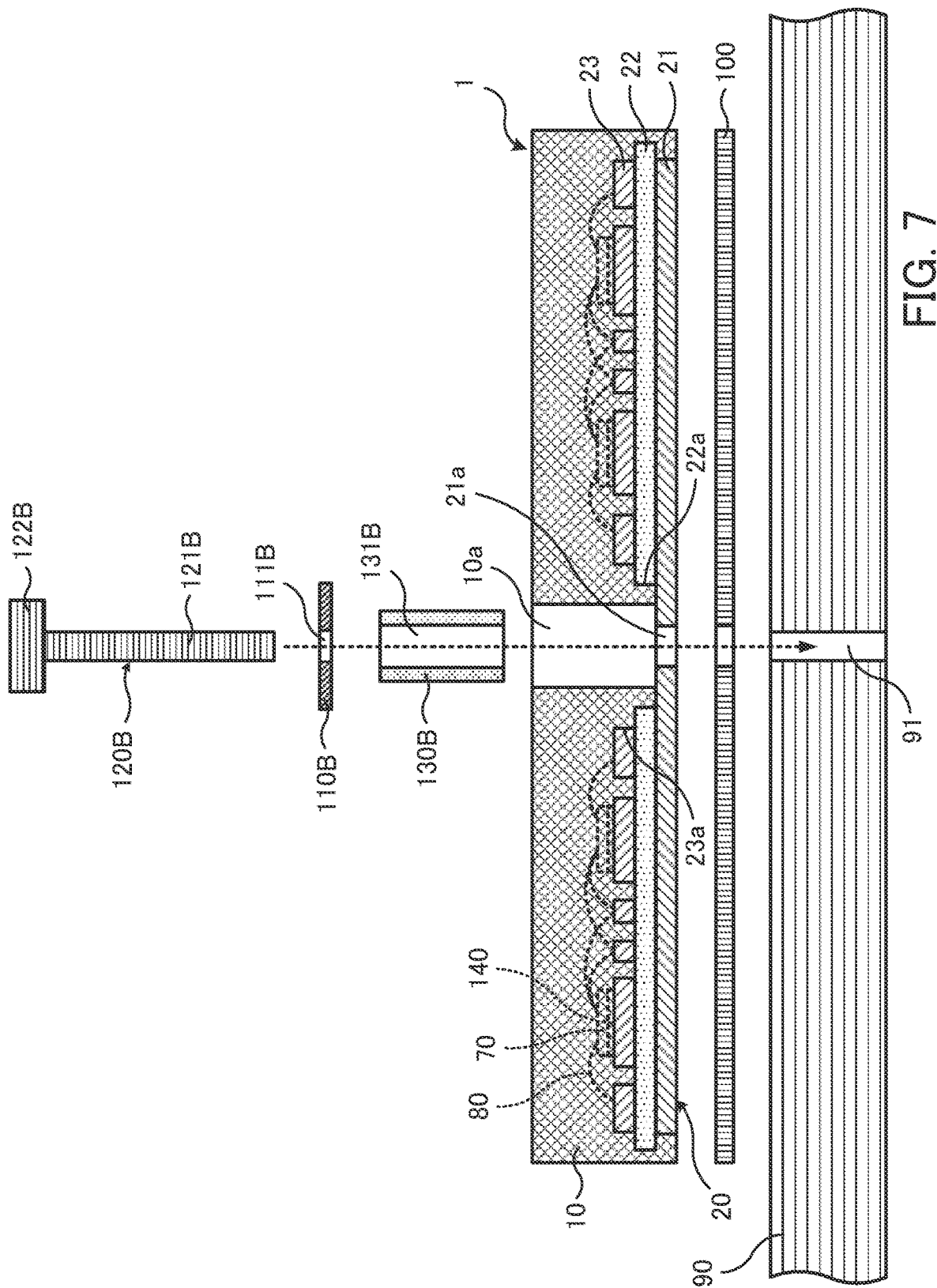
FIG. 7 illustrates an example of a semiconductor device according to a third embodiment (part 1)
Figure 8:
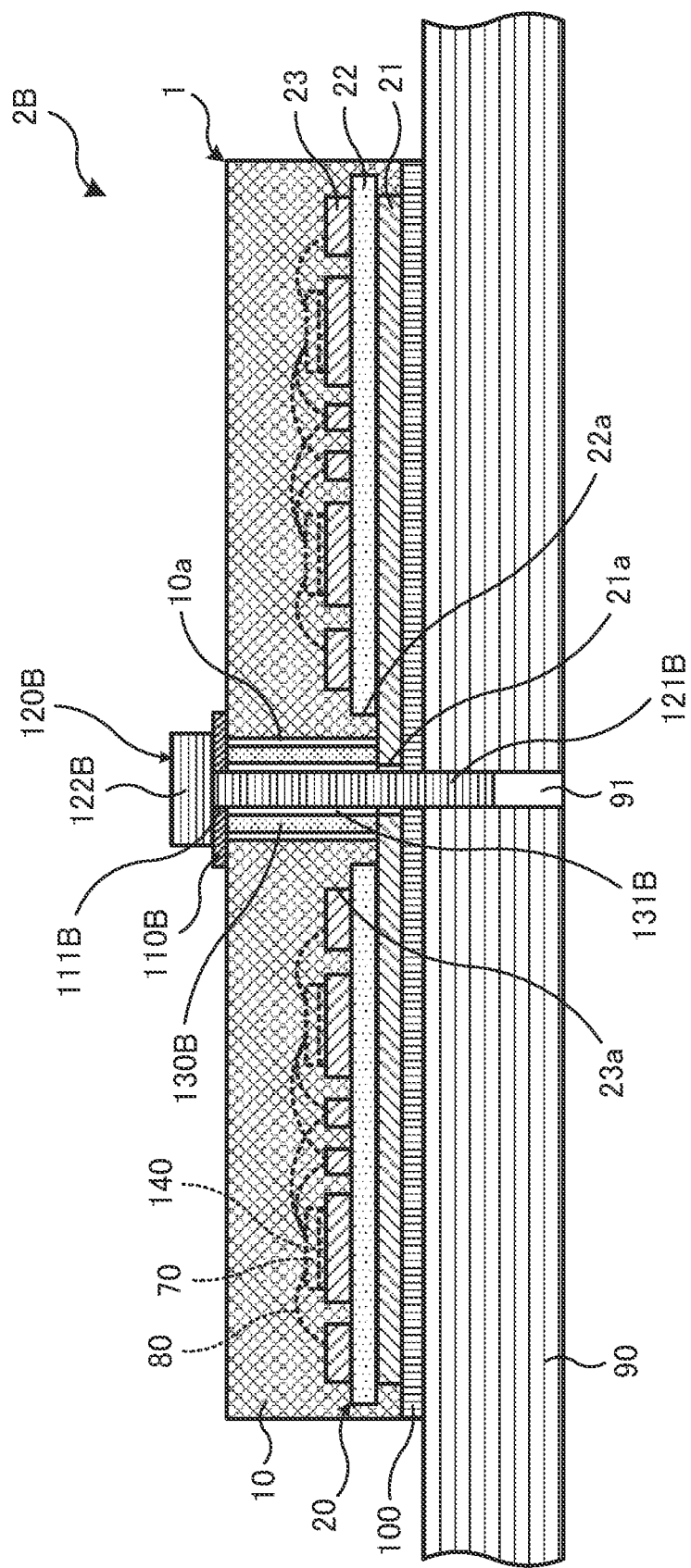
FIG. 8 illustrates the example of the semiconductor device according to the third embodiment (part 2)

FIGS. 7 and 8 each illustrate an example of a semiconductor device according to a third embodiment. Specifically, FIG. 7 is an exploded sectional view schematically illustrating a main part of an example of the semiconductor device. FIG. 8 is a sectional view schematically illustrating the main part of the example of the semiconductor device.

To assemble (manufacture) the semiconductor device including the semiconductor module 1 as described in the above first embodiment, the semiconductor module 1, a cooling member 90, a heat transfer medium 100, a spacer 130B, a washer 110B, and a screw member 120B as illustrated in FIG. 7 are prepared.

As the cooling member 90, the cooling member 90 as described in the above second embodiment, that is, the cooling member 90 having the screw attachment hole 91 into which the screw member 120B inserted into the first through hole 21a is screwed at a location facing the first through hole 21a in the conductor layer 21, is used.

As the heat transfer medium 100, the heat transfer medium 100 as described in the above second embodiment, that is, TIM disposed between the semiconductor module 1 and the cooling member 90 and disposed around the first through hole 21a in the conductor layer 21 and the screw attachment hole 91 in the cooling member 90, is used.

For example, the spacer 130B is made of metal material. For example, if the spacer 130B has a sufficient mechanical strength and if a sufficient connection strength is ensured when the semiconductor module 1 and the cooling member 90 are connected to each other by using the spacer 130B, the spacer 130B may be made of resin material. A cylindrical spacer having an outer diameter and a height such that the cylindrical spacer is storable in the third through hole 10a in the sealing resin 10 of the semiconductor module 1 is used as the spacer 130B. The spacer 130B has a hole 131B having an opening size into which a screw portion 121B of the screw member 120B inserted into the first through hole 21a in the conductor layer 21 is insertable. The spacer 130B has one end that comes into contact with the area (the terrace area 21c) around the first through hole 21a in the conductor layer 21, the area being inside the second through hole 22a in the insulating plate 22 inside the third through hole 10a in sealing resin 10.

If the third through hole 10a in the sealing resin 10 is formed to have an opening size larger than the second through hole 22a in the insulating plate 22, the spacer 130B is formed to have an outer diameter smaller than the second through hole 22a in the insulating plate 22.

For example, the washer 110B and the screw member 120B are made of metal material. For example, if the washer 110B and the screw member 120B each have a sufficient mechanical strength and if a sufficient connection strength is ensured when the semiconductor module 1 and the cooling member 90 are connected to each other by using the washer 110B and the screw member 120B, the washer 110B and the screw member 120B may be made of resin material.

A flat washer having an outer diameter larger than the third through hole 10a in the sealing resin 10 is used as the washer 110B. The washer 110B has a hole 111B having an opening size into which the screw portion 121B of the screw member 120B inserted into the first through hole 21a in the conductor layer 21 is insertable. The washer 110B has one end that comes into contact with the other end of the spacer 130B having one end that comes into contact with the area around the first through hole 21a in the conductor layer 21.

A screw, a bolt, or a small screw is used as the screw member 120B. The screw member 120B has the screw portion 121B and a head portion 122B. The screw portion 121B has a diameter insertable into the hole 111B in the washer 110B, the hole 131B in the spacer 130B, and the first through hole 21a in the conductor layer 21 and has a tip portion that is screwed into the screw attachment hole 91 in the cooling member 90. The head portion 122B is located in a direction opposite to the tip portion of the screw portion 121B. The head portion 122B has a diameter larger than the hole 111B in the washer 110B.

To assemble the semiconductor device 2B, for example, the semiconductor module 1, the cooling member 90, the heat transfer medium 100, the spacer 130B, the washer 110B, and the screw member 120B as illustrated in FIG. 7 are prepared. The semiconductor module 1 and the cooling member 90 are disposed such that the first through hole 21a and the screw attachment hole 91 face each other, and the heat transfer medium 100 is disposed between the semiconductor module 1 and the cooling member 90. Next, the screw member 120B is inserted into the hole 111B in the washer 110B and the hole 131B in the spacer 130B, and the screw portion 121B is inserted into the third through hole 10a in the sealing resin 10, the opening portion 23a in the circuit pattern layer 23, the second through hole 22a in the insulating plate 22, and the first through hole 21a in the conductor layer 21. The tip portion of the inserted screw portion 121B is screwed into the screw attachment hole 91 in the cooling member 90. As a result, the semiconductor device 2B as illustrated in FIG. 8, that is, the semiconductor device 2B in which the semiconductor module 1 and the cooling member 90 are connected to each other via the heat transfer medium 100 by using the screw member 120B, the washer 110B, and the spacer 130B, is obtained.

In the case of the semiconductor device 2B illustrated in FIG. 8, the tip portion of the screw portion 121B of the screw member 120B inserted into the third through hole 10a in the sealing resin 10, the opening portion 23a in the circuit pattern layer 23, the second through hole 22a in the insulating plate 22, and the first through hole 21a in the conductor layer 21 is screwed into the screw attachment hole 91 in the cooling member 90. The conductor layer 21 of the semiconductor module 1 is pressed toward the cooling member 90 by the head portion 122B of the screw member 120B via the spacer 130B and the washer 110B and is connected to the cooling member 90 via the heat transfer medium 100.

At this point, one end of the spacer 130B is into contact with the area (the terrace area 21c) around the first through hole 21a in the conductor layer 21, the area being inside the second through hole 22a in the insulating plate 22 inside the third through hole 10a in the sealing resin 10. The other end of the spacer 130B having this one end that is into contact with the area around the first through hole 21a in the conductor layer 21 is pressed toward the cooling member 90 by the head portion 122B of the screw member 120B screwed into the screw attachment hole 91 in the cooling member 90 via the washer 110B disposed outside the third through hole 10a in the sealing resin 10. The head portion 122B of the screw member 120B is disposed outside the third through hole 10a in the sealing resin 10, as with the washer 110B. As a result, the conductor layer 21 of the semiconductor module 1 is pressed toward the cooling member 90 by the screw member 120B, the washer 110B, and the spacer 130B and is connected to the cooling member 90 via the heat transfer medium 100. If the conductor layer 21, which is pressed toward the cooling member 90 by the screw member 120B, the washer 110B, and the spacer 130B, is formed to be relatively thick, because the rigidity of the conductor layer 21 is improved, the connection strength between the semiconductor module 1 and the cooling member 90 via the conductor layer 21 is improved.

In the case of the semiconductor device 2B, bonding material such as sintered material or solder is not used to connect the semiconductor module 1 and the cooling member 90. Instead, the heat transfer medium 100 such as TIM, the screw member 120B, the washer 110B, and the spacer 130B are used for the connection. Thus, no application of heat or pressure is needed for the connection. As a result, the bonding material 140 such as sintered material or solder connecting the semiconductor chips 70 to the circuit pattern layer 23 is prevented from being melted again by heat. In addition, the semiconductor chips 70 and components connected thereto are prevented from being damaged by pressure. In addition, the sealing resin 10 is prevented from being peeled by the heat or pressure from the insulated circuit board 20 on which the semiconductor chips 70, etc. are mounted.

In addition, in the case of the semiconductor device 2B, the area around the first through hole 21a in the conductor layer 21 is pressed toward the cooling member 90 by the head portion 122B of the screw member 120B via the washer 110B and the spacer 130B. If the circuit pattern layer 23 is pressed, the circuit pattern layer 23 could be damaged or a defect relating to the electrical connection among the circuit pattern layer 23 and the metal screw member 120B, washer 110B, and spacer 130B could occur. However, according to the present embodiment, such occurrence of damage or a defect is prevented. In addition, if the insulating plate 22 is pressed, the insulating plate 22 could be damaged. However, according to the present embodiment, such occurrence of damage is prevented.

Thus, the semiconductor device 2B effectively prevents quality deterioration that could occur when the semiconductor module 1 is connected to the cooling member 90 via the conductor layer 21.

In addition, if the screw member 120B, the washer 110B, and the spacer 130B of the semiconductor device 2B are made of metal material, the conductor layer 21 and the cooling member 90 are thermally and electrically connected to each other via the spacer 130B, the washer 110B, and the screw member 120B. The heat generated by the semiconductor module 1 is transferred to the cooling member 90 via not only the heat transfer medium 100 but also the spacer 130B, the washer 110B, and the screw member 120B. As a result, the heat dissipation from the semiconductor module 1 is improved, and damage to and performance deterioration of the semiconductor module 1 by overheating are prevented.

In the case of the semiconductor device 2B, the head portion 122B of the screw member 120B is disposed outside the third through hole 10a in the sealing resin 10. Thus, the screw member 120B may be formed to have a relatively large head portion 122B.

In the case of the semiconductor device 2B, the semiconductor module 1 and the cooling member 90 are connected to each other by screwing of the screw member 120B via the heat transfer medium 100. That is, while use of bonding material such as sintered material or solder needs particular equipment, no such particular equipment is needed in the present embodiment. That is, the semiconductor module 1 is connectable to a cooling member 90 of any kind or size.

Fourth Embodiment

Figure 9:
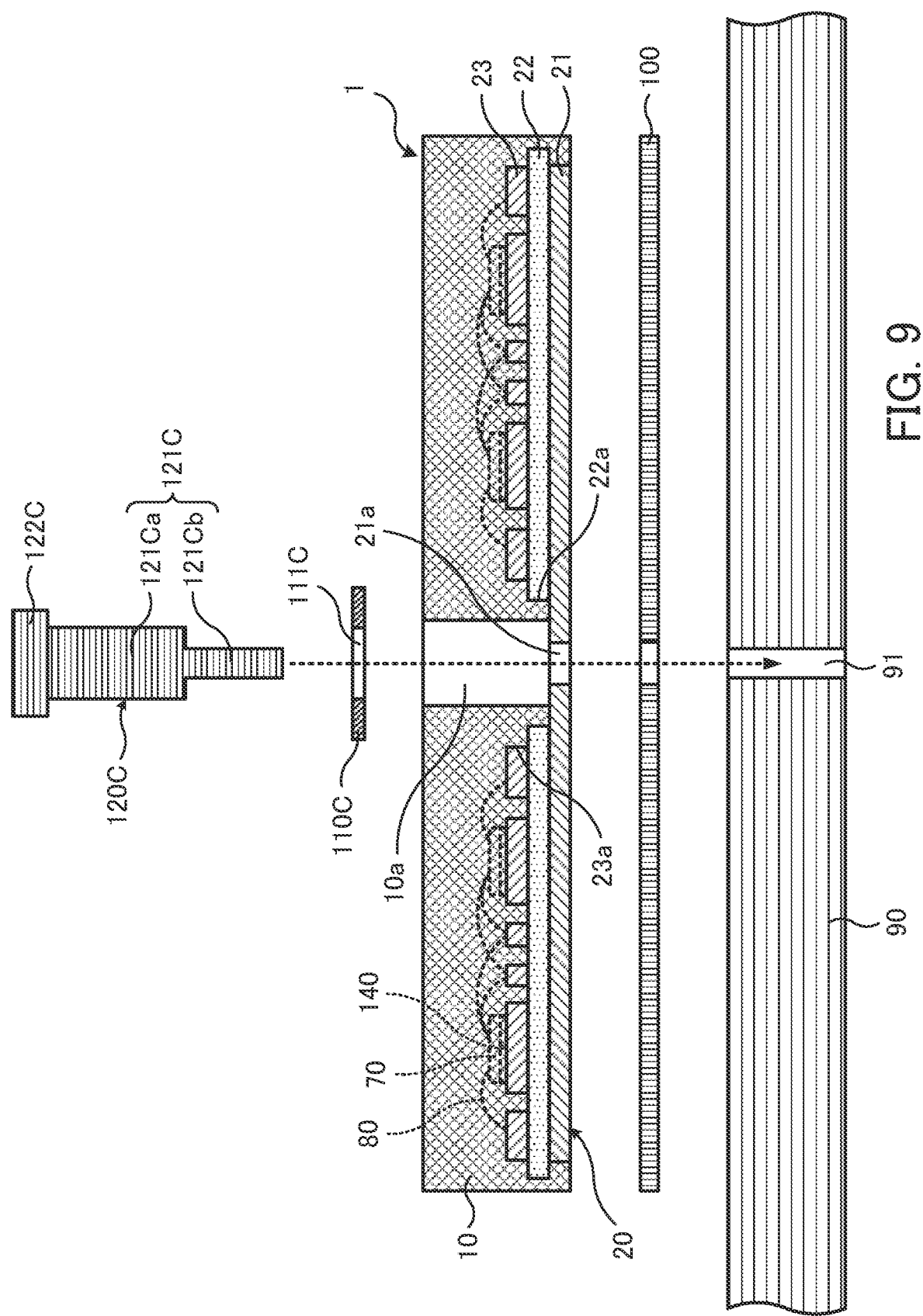
FIG. 9 illustrates an example of a semiconductor device according to a fourth embodiment (part 1)
Figure 10:
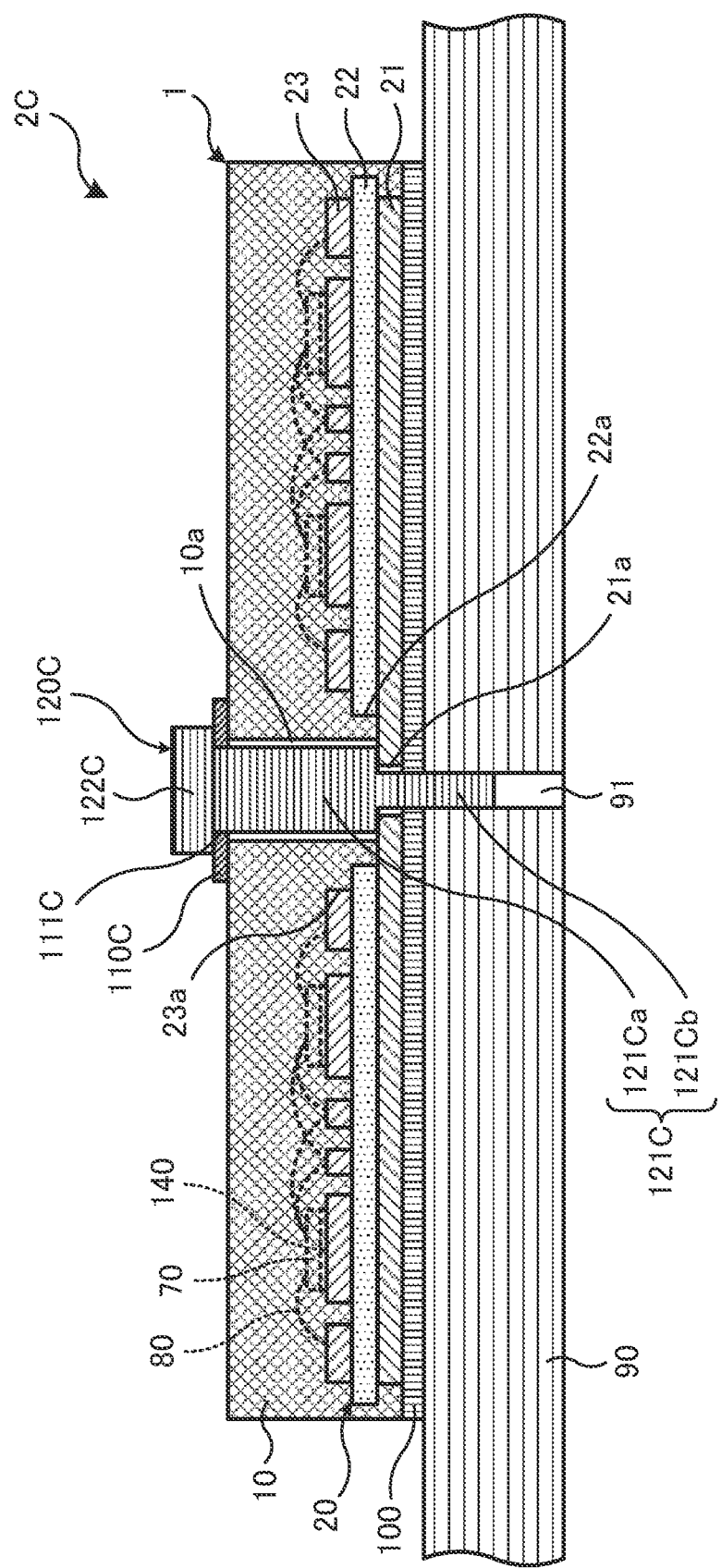
FIG. 10 illustrates the example of the semiconductor device according to the fourth embodiment (part 2)

FIGS. 9 and 10 each illustrate an example of a semiconductor device according to a fourth embodiment. Specifically, FIG. 9 is an exploded sectional view schematically illustrating a main part of an example of the semiconductor device. FIG. 10 is a sectional view schematically illustrating the main part of the example of the semiconductor device.

To assemble (manufacture) the semiconductor device including the semiconductor module 1 as described in the above first embodiment, the semiconductor module 1, a cooling member 90, a heat transfer medium 100, a washer 110C, and a screw member 120C as illustrated in FIG. 9 are prepared.

The cooling member 90 as described in the above second embodiment, that is, the cooling member 90 having the screw attachment hole 91 into which the screw member 120C inserted into the first through hole 21a is screwed at a location facing the first through hole 21a in the conductor layer 21, is used.

The heat transfer medium 100 as described in the second embodiment, that is, TIM disposed between the semiconductor module 1 and the cooling member 90 and disposed around the first through hole 21a in the conductor layer 21 and the screw attachment hole 91 in the cooling member 90, is used as the heat transfer medium 100.

For example, the washer 110C and the screw member 120C are made of metal material. For example, if the washer 110C and the screw member 120C each have a sufficient mechanical strength and if a sufficient connection strength is ensured when the semiconductor module 1 and the cooling member 90 are connected to each other by using the washer 110C and the screw member 120C, the washer 110C and the screw member 120C may be made of resin material.

A flat washer having an outer diameter larger than the third through hole 10a in the sealing resin 10 is used as the washer 110C. The washer 110C has a hole 111C having an opening size into which the screw portion 121C of the screw member 120C is insertable.

A screw, a bolt, or a small screw is used as the screw member 120C. The screw member 120C has a screw portion 121C having a tip portion screwed into the screw attachment hole 91 in the cooling member 90 and a head portion 122C located in a direction opposite to the tip portion of the screw portion 121C. The screw portion 121C has a first portion 121Ca having a diameter that is inserted into the hole 111C in the washer 110C and the third through hole 10a in the sealing resin 10 and that is not inserted into the first through hole 21a in the conductor layer 21. The screw portion 121C also has a second portion 121Cb having a diameter smaller than that of the first portion 121Ca and inserted into the first through hole 21a. The head portion 122C has a diameter larger than the hole 111C in the washer 110C.

To assemble the semiconductor device 2C, for example, the semiconductor module 1, the cooling member 90, the heat transfer medium 100, the washer 110C, and the screw member 120C as illustrated in FIG. 9 are prepared. The semiconductor module 1 and the cooling member 90 are disposed such that the first through hole 21a and the screw attachment hole 91 face each other, and the heat transfer medium 100 is disposed between the semiconductor module 1 and the cooling member 90. Next, the screw member 120C is inserted into the hole 111C in the washer 110C. The thick first portion 121Ca of the screw portion 121C is inserted into the third through hole 10a in the sealing resin 10, the opening portion 23a in the circuit pattern layer 23, and the second through hole 22a in the insulating plate 22. The thin second portion 121Cb of the screw portion 121C is inserted into the first through hole 21a in the conductor layer 21. The tip portion of the inserted screw portion 121C is screwed into the screw attachment hole 91 in the cooling member 90. As a result, the semiconductor device 2C as illustrated in FIG. 10, that is, the semiconductor device 2C in which the semiconductor module 1 and the cooling member 90 are connected to each other via the heat transfer medium 100 by using the screw member 120C and the washer 110C, is obtained.

In the case of the semiconductor device 2C illustrated in FIG. 10, the tip portion of the screw portion 121C of the screw member 120C inserted into the third through hole 10a in the sealing resin 10, the opening portion 23a in the circuit pattern layer 23, the second through hole 22a in the insulating plate 22, and the first through hole 21a in the conductor layer 21 is screwed into the screw attachment hole 91 in the cooling member 90. The conductor layer 21 of the semiconductor module 1 is pressed toward the cooling member 90 by the screw member 120C and is connected to the cooling member 90 via the heat transfer medium 100.

At this point, the thick first portion 121Ca of the screw portion 121C of the screw member 120C comes into contact with the area (the terrace area 21c in the conductor layer 21) around the first through hole 21a in the conductor layer 21, the area being inside the second through hole 22a in the insulating plate 22 inside the third through hole 10a in the sealing resin 10. The thick first portion 121Ca that comes into contact with the area around the first through hole 21a in the conductor layer 21 presses the conductor layer 21 toward the cooling member 90 when the screw member 120C (the thin second portion 121Cb) is screwed into the screw attachment hole 91. In this way, the thick first portion 121Ca of the screw portion 121C presses the conductor layer 21 toward the cooling member 90, and the semiconductor module 1 is connected to the cooling member 90 via the heat transfer medium 100. If the conductor layer 21, which is pressed toward the cooling member 90 by the thick first portion 121Ca of the screw portion 121C, is formed to be relatively thick, because the rigidity of the conductor layer 21 is improved, the connection strength between the semiconductor module 1 and the cooling member 90 via the conductor layer 21 is improved.

In the case of the semiconductor device 2C, bonding material such as sintered material or solder is not used to connect the semiconductor module 1 and the cooling member 90. Instead, the heat transfer medium 100 such as TIM, the screw member 120C, and the washer 110C are used for the connection. Thus, no application of heat or pressure is needed for the connection. As a result, the bonding material 140 such as sintered material or solder connecting the semiconductor chips 70 to the circuit pattern layer 23 is prevented from being melted again by heat. In addition, the semiconductor chips 70 and components connected thereto are prevented from being damaged by pressure. In addition, the sealing resin 10 is prevented from being peeled by the heat or pressure from the insulated circuit board 20 on which the semiconductor chips 70, etc. are mounted.

In addition, in the case of the semiconductor device 2C, the area around the first through hole 21a in the conductor layer 21 is pressed toward the cooling member 90 by the thick first portion 121Ca of the screw portion 121C of the screw member 120C. If the circuit pattern layer 23 is pressed, the circuit pattern layer 23 could be damaged or a defect relating to the electrical connection between the circuit pattern layer 23 and the metal screw member 120C and washer 110C could occur. However, according to the present embodiment, such occurrence of damage or a defect is prevented. In addition, if the insulating plate 22 is pressed, the insulating plate 22 could be damaged. However, according to the present embodiment, such occurrence of damage is prevented.

Thus, the semiconductor device 2C effectively prevents quality deterioration that could occur when the semiconductor module 1 is connected to the cooling member 90 via the conductor layer 21.

In addition, if the screw member 120C of the semiconductor device 2C is made of metal material, the conductor layer 21 and the cooling member 90 are thermally and electrically connected to each other via the screw member 120C. The heat generated by the semiconductor module 1 is transferred to the cooling member 90 via not only the heat transfer medium 100 but also the screw member 120C. As a result, the heat dissipation from the semiconductor module 1 is improved, and damage to and performance deterioration of the semiconductor module 1 by overheating are prevented.

In the case of the semiconductor device 2C, the head portion 122C of the screw member 120C is disposed outside the third through hole 10a in the sealing resin 10. Thus, the screw member 120C may be formed to have a relatively large head portion 122C.

In the case of the semiconductor device 2C, the semiconductor module 1 and the cooling member 90 are connected to each other by screwing of the screw member 120C via the heat transfer medium 100. That is, while use of bonding material such as sintered material or solder needs particular equipment, no such particular equipment is needed in the present embodiment. That is, the semiconductor module 1 is connectable to a cooling member 90 of any kind or size.

Next, a variation will be described as a fifth embodiment.

Fifth Embodiment

Figure 11A:
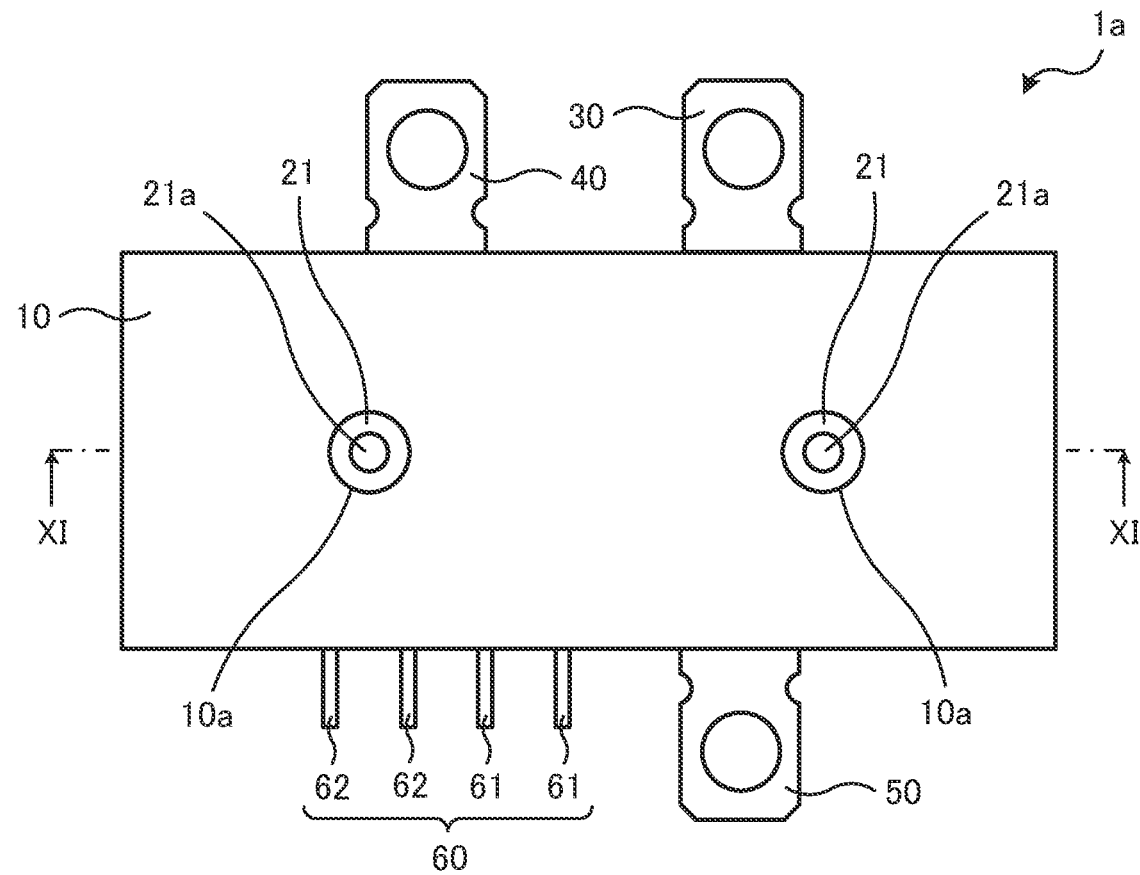
FIGS. 11A and 11B each illustrate an example of a semiconductor module according to a fifth embodiment.
Figure 11B:
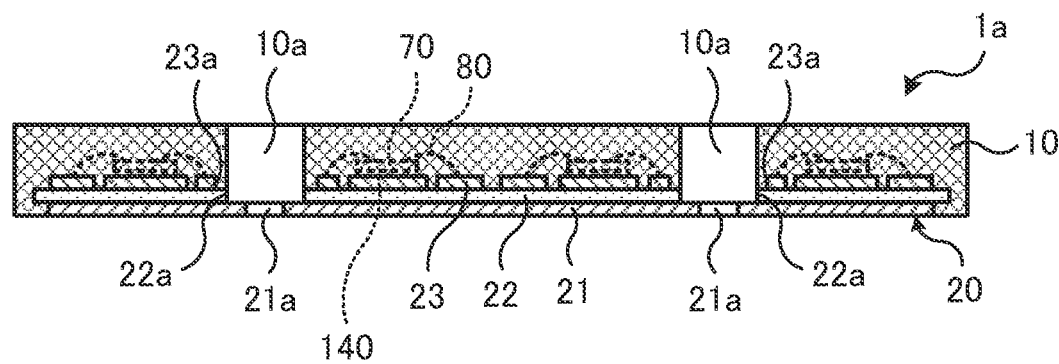

FIGS. 11A and 11B each illustrate an example of a semiconductor module according to a fifth embodiment. Specifically, FIG. 11A is a plan view schematically illustrating a main part of an example of a semiconductor device. FIG. 11B is a sectional view schematically illustrating the main part of the example of the semiconductor device. FIG. 11B is a schematic sectional view taken along a line XI-XI in FIG. 11A.

The semiconductor module (also referred to as a "semiconductor device") 1a illustrated in FIGS. 11A and 11B differs from the semiconductor module 1 as described in the above first embodiment in that the semiconductor module 1a includes two sets of the first through hole 21a in the conductor layer 21, the second through hole 22a in the insulating plate 22, the opening portion 23a in the circuit pattern layer 23, and the third through hole 10a in the sealing resin 10 disposed to face each other at different locations. The semiconductor chips 70 are connected to the circuit pattern layer 23 of the semiconductor module 1a by using the bonding material 140 or electrically conductive members 80. The circuit pattern layer 23 is also connected to the P terminal 30, the N terminal 40, the output terminal 50, the control terminals 60, etc.

In the case of the semiconductor module 1a, a predetermined screw member is insertable into each set of the third through hole 10a, the opening portion 23a, the second through hole 22a, and the first through hole 21a. The semiconductor module 1a is connected to a cooling member 90a via heat transfer medium 100. An example of the semiconductor device in which the semiconductor module 1a and the cooling member 90a are connected is illustrated in FIG. 12.

Figure 12:
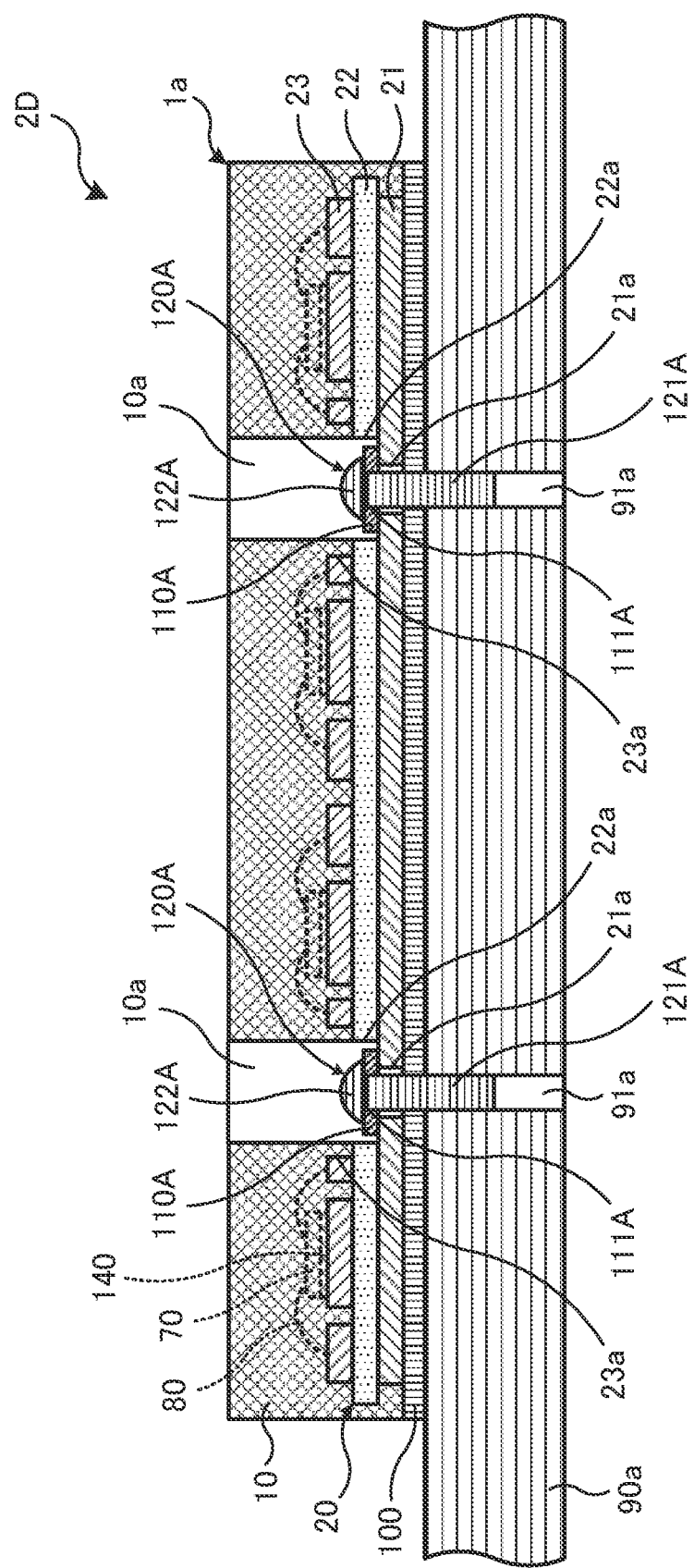
FIG. 12 illustrates an example of a semiconductor device according to the fifth embodiment.

FIG. 12 illustrates the example of the semiconductor device according to the fifth embodiment. Specifically, FIG. 12 is a sectional view schematically illustrating a main part of an example of the semiconductor device.

The cooling member 90a connected to the semiconductor module 1a has screw attachment holes 91a, each of which is located to face a corresponding one of the first through holes 21a in the conductor layer 21. The semiconductor module 1a and the cooling member 90a are disposed such that the first through holes 21a face their respective screw attachment holes 91a, and the heat transfer medium 100 such as TIM is disposed therebetween. Next, for example, an individual screw member 120A as described in the above second embodiment is inserted into a corresponding washer 110A, third through hole 10a, opening portion 23a, second through hole 22a, and first through hole 21a. The tip portions of the screw portions 121A of the inserted screw members 120A are screwed into their respective screw attachment holes 91a in the cooling member 90a. As a result, the semiconductor device 2D as illustrated in FIG. 12, that is, the semiconductor device 2D in which the semiconductor module 1a and the cooling member 90a are connected to each other via the heat transfer medium 100 by using the two sets of the screw member 120A and washer 110A, is obtained.

The semiconductor device 2D provides the same advantageous effects as those provided by the semiconductor device 2A according to the second embodiment. In addition, in the case of the semiconductor device 2D, because the semiconductor module 1a and the cooling member 90a are connected to each other by using the two sets of the screw member 120A and the washer 110A at two different locations, the semiconductor module 1a is prevented from rotating and shifting in a planar direction of the cooling member 90a.

The present embodiment has been described based on an example in which the semiconductor module 1a is connected to the cooling member 90a by using the screw members 120A and the washers 110A, each of which has been described in the above second embodiment. Alternatively, the semiconductor module 1a may be connected to the cooling member 90a by using the screw members 120B, the washers 110B, and the spacers 130B, each of which has been described in the above third embodiment, or by using the screw members 120C and the washers 110C, each of which has been described in the above fourth embodiment.

The sets of the first through hole 21a, the second through hole 22a, the opening portion 23a, the third through hole 10a, and the screw attachment hole 91a disposed to face each other are not limited in arrangement and number to those illustrated in FIGS. 11A and 11B and FIG. 12. For example, three or more sets may be formed on a straight line (for example, a straight line that goes through a center part of the semiconductor module 1a) parallel to a side of the semiconductor module 1a (an outer edge of the sealing resin 10) in plan view. Alternatively, two or more sets may be formed on different locations on a diagonal line that goes through a center part of the semiconductor module 1a in plan view. Alternatively, four sets may be formed at four corners of the semiconductor module 1a in plan view.

Next, an example of a manufacturing method of a semiconductor module and a semiconductor device including the semiconductor module will be described as a sixth embodiment.

Sixth Embodiment

Figure 13:
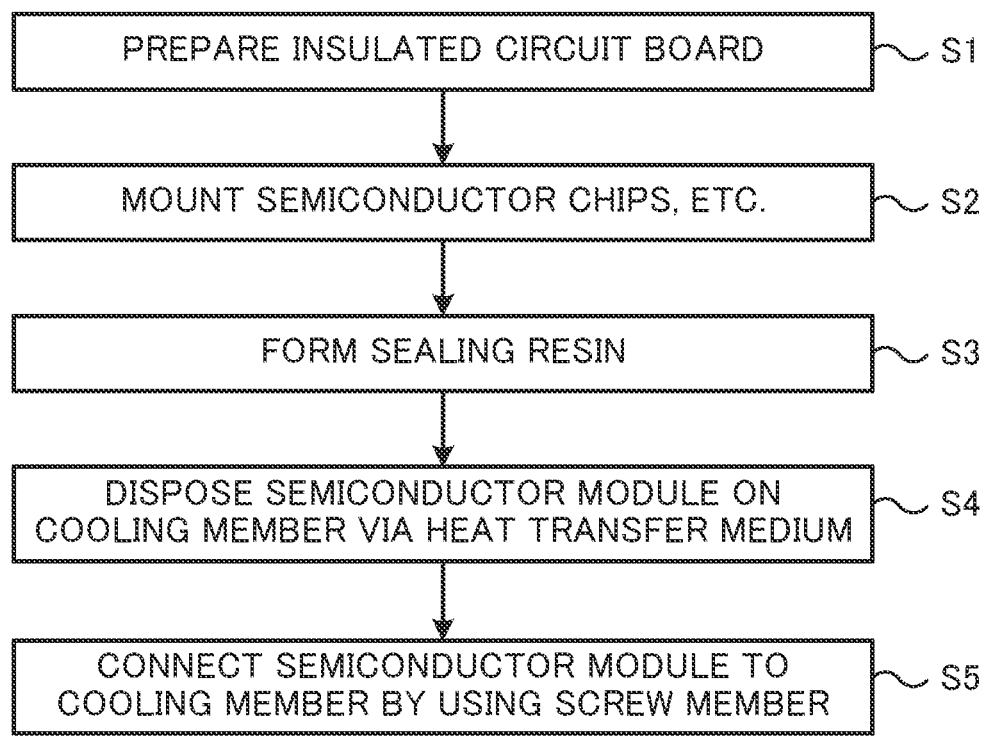
FIG. 13 illustrates an example of a semiconductor device manufacturing method according to a sixth embodiment.

FIG. 13 illustrates an example of a semiconductor device manufacturing method according to a sixth embodiment.

For example, the insulated circuit board 20 as described in the above first embodiment is prepared (step S1). That is, the insulated circuit board 20 including the conductor layer 21, the insulating plate 22 on the conductor layer 21, and the circuit pattern layer 23 on the insulating plate 22 is prepared. The conductor layer 21 has the first through hole 21a, and the insulating plate 22 has the second through hole 22a having an opening size larger than the first through hole 21a. The circuit pattern layer 23 has the opening portion 23a having an opening size larger than the second through hole 22a. The second through hole 22a is located to face the first through hole 21a, and the opening portion 23a is located to face the second through hole 22a. The first through hole 21a, the second through hole 22a, and the opening portion 23a are located to face each other. At least one set of the first through hole 21a, the second through hole 22a, and the opening portion 23a is formed in at least one predetermined location of the insulated circuit board 20.

The semiconductor chips 70, the P terminal 30, the N terminal 40, the output terminal 50, the control terminals 60, etc. as described above are mounted on the prepared insulated circuit board 20 (step S2). The P terminal 30, the N terminal 40, the output terminal 50, and the control terminals 60 are connected to predetermined portions of the circuit pattern layer 23 of the insulated circuit board 20. The semiconductor chips 70 are mounted on predetermined portions of the circuit pattern layer 23 by using the bonding material 140 such as sintered material or solder and are connected by using electrically conductive members 80 such as wires.

After the semiconductor chips 70, etc. are mounted on the insulated circuit board 20, the sealing resin 10 is formed (step S3). The sealing resin 10 seals part of each of the P terminal 30, the N terminal 40, the output terminal 50, and the control terminals 60. The sealing resin 10 also seals the semiconductor chips 70, the circuit pattern layer 23 on which the semiconductor chips 70 are mounted, and the electrically conductive members 80 connected to the semiconductor chips 70. The sealing resin 10 is formed to have the third through hole 10a having an opening size larger than the first through hole 21a at a location facing the first through hole 21a in the conductor layer 21. If a plurality of sets of the first through hole 21a (and a plurality of sets of the second through hole 22a and the opening portion 23a facing the first through hole 21a) are formed at a plurality of locations, a plurality of third through holes 10a are formed at their respective sets.

Through steps S1, S2, and S3, the semiconductor module 1 or 1a including the insulated circuit board 20 and the sealing resin 10 is formed.

For example, the formed semiconductor module 1, etc. is disposed on the above cooling member 90 or cooling member 90a via the heat transfer medium 100 such as TIM (step S4). For example, the semiconductor module 1, etc. is disposed such that the first through hole 21a in the conductor layer 21, the screw attachment hole 91 in the cooling member 90, etc. face each other. For example, the heat transfer medium 100 is disposed around the first through hole 21a, the screw attachment hole 91, etc. between the semiconductor module 1, etc. and the cooling member 90, etc.

For example, the semiconductor module 1, etc. disposed on the cooling member 90, etc. via the heat transfer medium 100 is connected and fixed to the cooling member 90, etc. by using a predetermined screw member, etc. (step S5). For example, the semiconductor module 1, etc. is connected to the cooling member 90, etc. by using the screw member 120A and washer 110A as described in the above second embodiment. Alternatively, the semiconductor module 1, etc. may be connected to the cooling member 90, etc. by using the screw member 120B, the washer 110B, and the spacer 130B as described in the above third embodiment or by using the screw member 120C and the washer 110C as described in the above fourth embodiment.

Through step S5, for example, the area (the terrace area 21c) around the first through hole 21a in the conductor layer 21, the area being inside the second through hole 22a in the insulating plate 22, is pressed toward the cooling member 90, etc. by the predetermined screw member, and as a result, the semiconductor module 1, etc. is connected to the cooling member 90, etc. via the heat transfer medium 100.

In accordance with the above method, the semiconductor device including the semiconductor module 1, etc., the cooling member 90, etc. is manufactured. In accordance with the above method, for example, the semiconductor module 1, etc. and the cooling member 90, etc. are connectable without application of heat or pressure. In this way, remelting of the bonding material 140 and peeling of the sealing resin 10 are prevented. In addition, for example, the semiconductor module 1, etc. and the cooling member 90, etc. are connected to each other by pressing the conductor layer 21 with the predetermined screw member, etc. If the semiconductor module 1, etc. and the cooling member 90, etc. are connected to each other by pressing the circuit pattern layer 23 or the insulating plate 22, the circuit pattern layer 23 or the insulating plate 22 could be damaged or an electrical defect could occur. However, in accordance with the above method, such occurrence of damage or a defect is prevented. Thus, in accordance with the above method, there is manufactured a semiconductor device that effectively prevents quality deterioration that could occur when the semiconductor module 1 is connected to the cooling member 90 via the conductor layer 21.

In one aspect, quality deterioration that could occur when a semiconductor device is connected to a member via a conductor layer is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a first conductor layer having a first through hole;
    an insulating plate disposed on the first conductor layer and having a second through hole having an opening size larger than an opening size of the first through hole at a position facing the first through hole;
    a second conductor layer that includes a circuit pattern and is disposed on the insulating plate, the second conductor layer having an opening with an opening size larger than the opening size of the second through hole at a position facing the second through hole; and
    a semiconductor chip mounted on the second conductor layer, wherein
    the first conductor layer is disposed on a first surface side of the insulating plate,
    the second conductor layer is disposed on a second surface side of the insulating plate opposite to the first surface side, and
    the semiconductor chip is mounted on one surface side of the second conductor layer opposite to another surface side of the second conductor layer that faces the insulating plate.

2. The semiconductor device according to claim 1, comprising sealing resin that seals the second conductor layer and the semiconductor chip and that has a third through hole having an opening size larger than the opening size of the first through hole at a position facing the first through hole.

3. The semiconductor device according to claim 2, further comprising:
    a cooling member that is disposed adjacent to the first conductor layer at a side of the first conductor layer opposite to a side of the first conductor layer where the insulating plate is disposed, and that has a screw attachment hole at a position facing the first through hole; and
    a heat transfer medium disposed between the first conductor layer and the cooling member so as to be arranged around the first through hole and the screw attachment hole.

4. The semiconductor device according to claim 3, further comprising a screw member having a screw portion and a head portion,
    wherein the screw portion is inserted into the third through hole, the opening, the second through hole, and the first through hole and has a tip portion screwed into the screw attachment hole, and
    wherein the head portion is formed at a side of the screw portion opposite to a side of the screw portion where the tip portion is formed, and presses an area around the first through hole inside the second through hole toward the cooling member.

5. The semiconductor device according to claim 4, wherein the first conductor layer is thermally and electrically connected to the cooling member via the screw member.

6. The semiconductor device according to claim 4, wherein the head portion is disposed inside the third through hole and presses an area around the first through hole inside the second through hole toward the cooling member.

7. The semiconductor device according to claim 4, further comprising a cylindrical spacer disposed inside the third through hole and having one end that is in contact with the area around the first through hole inside the second through hole,
    wherein the head portion is disposed outside the third through hole and presses another end of the spacer to press the area around the first through hole inside the second through hole toward the cooling member via the spacer.

8. The semiconductor device according to claim 4,
    wherein the screw portion has a first portion that is inserted into the third through hole and is not inserted into the first through hole, and a second portion that is inserted into the first through hole and has a diameter smaller than a diameter of the first portion, and
    wherein the head portion is disposed outside the third through hole and presses the area around the first through hole inside the second through hole toward the cooling member via the first portion.

9. The semiconductor device according to claim 4, further comprising a plurality of sets of the first through hole, the second through hole, the opening portion, the third through hole, and the screw attachment hole,
    wherein the screw member is provided in plurality, and each of the screw members is disposed in a corresponding one of the sets such that each of the screw portions is inserted into the corresponding third through hole, opening, second through hole, and first through hole, each of the tip portions is screwed into the corresponding screw attachment hole, and each of the head portions presses the area around the corresponding first through hole inside the corresponding second through hole toward the cooling member.

10. The semiconductor device according to claim 1, wherein a thickness of the first conductor layer is greater than a thickness of the second conductor layer.

11. A semiconductor device manufacturing method, comprising:
    preparing an insulated circuit board that includes a first conductor layer having a first through hole, an insulating plate disposed on the first conductor layer at a side thereof and having a second through hole having an opening size larger than an opening size of the first through hole at a position facing the first through hole, and a second conductor layer that includes a circuit pattern and is disposed on the insulating plate, the second conductor layer having an opening having an opening size larger than the opening size of the second through hole at a location facing the second through hole; and
    mounting a semiconductor chip on the second conductor layer, wherein
    the first conductor layer is disposed on a first surface side of the insulating plate,
    the second conductor layer is disposed on a second surface side of the insulating plate opposite to the first surface side, and
    the semiconductor chip is mounted on one surface side of the second conductor layer opposite to another surface side of the second conductor layer that faces the insulating plate.

12. The semiconductor device manufacturing method according to claim 11, further comprising forming sealing resin that seals the second conductor layer and the semiconductor chip and that has a third through hole having an opening size larger than the opening size of the first through hole at a position facing the first through hole.

13. The semiconductor device manufacturing method according to claim 12, further comprising:
- disposing a cooling member having a screw attachment hole at a position facing the first through hole adjacent to the first conductor layer at a side of the first conductor layer opposite to a side of the first conductor layer where the insulating plate is disposed; and
- disposing a heat transfer medium between the first conductor layer and the cooling member so as to be arranged around the first through hole and the screw attachment hole.

14. The semiconductor device manufacturing method according to claim 13, further comprising:
- inserting a screw portion of a screw member into the third through hole, the opening, the second through hole, and the first through hole;
- screwing a tip portion of the screw portion into the screw attachment hole; and
- pressing, by a head portion of the screw member, an area around the first through hole inside the second through hole toward the cooling member, the head portion being located at a side of the screw portion opposite to the side of the screw portion where the tip portion is formed.

* * * * *